US009432946B2

(12) United States Patent
Yamanouchi

(10) Patent No.: US 9,432,946 B2
(45) Date of Patent: Aug. 30, 2016

(54) TRANSMISSION APPARATUS AND TRANSMISSION METHOD

(71) Applicant: Shingo Yamanouchi, Tokyo (JP)

(72) Inventor: Shingo Yamanouchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 177 days.

(21) Appl. No.: 14/384,413

(22) PCT Filed: Jan. 28, 2013

(86) PCT No.: PCT/JP2013/051724
§ 371 (c)(1),
(2) Date: Sep. 11, 2014

(87) PCT Pub. No.: WO2013/136860
PCT Pub. Date: Sep. 19, 2013

(65) Prior Publication Data
US 2015/0111511 A1  Apr. 23, 2015

(30) Foreign Application Priority Data

Mar. 12, 2012 (JP) ................................. 2012-054398

(51) Int. Cl.
*H04B 1/04* (2006.01)
*H04W 52/04* (2009.01)
(Continued)

(52) U.S. Cl.
CPC ............ *H04W 52/04* (2013.01); *H03F 1/0222* (2013.01); *H03F 1/0238* (2013.01);
(Continued)

(58) Field of Classification Search
CPC .. H03F 1/0233; H03F 1/0238; H03F 1/3247;
H03F 1/3282; H03F 1/3294; H03F 3/24;
H03G 3/004; H03G 3/3042; H04L 27/28;
H04L 27/361; H04L 27/362; H04L 27/368
USPC ............ 455/114.3, 115.1, 115.3, 126, 127.1,
455/127.4
See application file for complete search history.

(56) References Cited

U.S. PATENT DOCUMENTS 7,558,542 B2 * 7/2009 Nandipaku ............... H03C 5/00
332/145
7,962,108 B1 * 6/2011 Khlat ................... H04B 1/0475
455/114.3
(Continued)

FOREIGN PATENT DOCUMENTS

JP    2004-527956 A    9/2004
JP    2005-244826 A    8/2005
(Continued)

OTHER PUBLICATIONS

Nobuhiko Miki, et. al., "Carrier Aggregation for achieving Broadband in LTE-Advanced-Advanced", NTT DoCoMo Technical Journal, pp. 12-21, vol. 18, No. 2.
(Continued)

*Primary Examiner* — Duc M Nguyen
(74) *Attorney, Agent, or Firm* — Sughrue Mion, PLLC

(57) ABSTRACT

A transmission apparatus of the present invention includes polar modulator (601) that generates a power supply modulation signal and RF signals of a plurality of carrier frequency bands to be transmitted, power amplifier (603) that amplifies the RF signals from polar modulator (601), and power supply modulator (602) that modulates the power supply terminal of power amplifier (603) by a signal obtained by amplifying the power supply modulation signal from polar modulator (601). The power supply modulation signal is set based on a function using, as an argument, the power of the RF signal of each carrier frequency band output from power amplifier (603).

20 Claims, 16 Drawing Sheets

(51) Int. Cl.
*H03F 1/02* (2006.01)
*H03F 1/32* (2006.01)
*H03F 3/195* (2006.01)
*H03F 3/24* (2006.01)
*H03F 3/72* (2006.01)
*H04W 52/52* (2009.01)
*H04L 27/36* (2006.01)

(52) U.S. Cl.
CPC ......... *H03F 1/0277* (2013.01); *H03F 1/3247* (2013.01); *H03F 3/195* (2013.01); *H03F 3/245* (2013.01); *H03F 3/72* (2013.01); *H04B 1/04* (2013.01); *H04W 52/52* (2013.01); *H03F 2200/111* (2013.01); *H03F 2200/204* (2013.01); *H03F 2200/207* (2013.01); *H03F 2200/411* (2013.01); *H03F 2200/429* (2013.01); *H03F 2201/3233* (2013.01); *H03F 2203/7215* (2013.01); *H03F 2203/7221* (2013.01); *H03F 2203/7236* (2013.01); *H03F 2203/7239* (2013.01); *H04B 1/0483* (2013.01); *H04B 2001/045* (2013.01); *H04L 27/362* (2013.01)

(56) References Cited

U.S. PATENT DOCUMENTS

| | | | | |
|---|---|---|---|---|
| 9,240,757 | B2* | 1/2016 | Yamanouchi | H03F 1/0277 |
| 2002/0025789 | A1* | 2/2002 | Hayashihara | H03G 3/3042 |
| | | | | 455/127.5 |
| 2002/0044014 | A1* | 4/2002 | Wright | H03F 1/3241 |
| | | | | 330/2 |
| 2002/0146993 | A1 | 10/2002 | Persico et al. | |
| 2002/0196864 | A1* | 12/2002 | Booth | H03F 1/3294 |
| | | | | 375/296 |
| 2004/0198414 | A1* | 10/2004 | Hunton | H03F 1/0222 |
| | | | | 455/550.1 |
| 2005/0110562 | A1* | 5/2005 | Robinson | H03F 1/0227 |
| | | | | 330/10 |
| 2006/0178120 | A1* | 8/2006 | Puma | H03F 1/3241 |
| | | | | 455/114.3 |
| 2007/0184793 | A1 | 8/2007 | Drogi et al. | |
| 2009/0202006 | A1* | 8/2009 | Ahmed | H04L 27/2626 |
| | | | | 375/260 |
| 2009/0233644 | A1* | 9/2009 | McCune, Jr. | H04B 1/0483 |
| | | | | 455/561 |
| 2010/0291886 | A1* | 11/2010 | Plevridis | H03C 5/00 |
| | | | | 455/110 |
| 2010/0327988 | A1* | 12/2010 | Brandt | H03F 1/3247 |
| | | | | 332/149 |

FOREIGN PATENT DOCUMENTS

| | | | |
|---|---|---|---|
| JP | 2006-270923 | A | 10/2006 |
| JP | 2006-324878 | A | 11/2006 |
| JP | 2008-205821 | A | 9/2008 |
| JP | 2009-525695 | A | 7/2009 |
| JP | 2010-41721 | A | 2/2010 |
| JP | 2010-278992 | A | 12/2010 |
| JP | 2011-512098 | A | 4/2011 |
| JP | 2011-188123 | A | 9/2011 |

OTHER PUBLICATIONS

Paolo Colantonio, et.al., "A Design Technique for Concurrent Dual-Band Harmonic Tuned Power Amplifier", IEEE Transactions on Microwave Theory and Techniques, 2008, pp. 2545-2555, vol. 56, No. 11.

Shouhei Kousai, et al., "An Octave-Range, Watt-Level, Fully-Integrated CMOS Switching Power Mixer Array for Linearization and Back-Off-Efficiency Improvement", IEEE Journal of Solid-State Circuits, 2009, pp. 3376-3392, vol. 44, No. 12.

Paul Saad, et al., "Design of a Highly Efficient 2-4GHz Octave Bandwidth GAN-HEMT Power Amplifier", IEEE Transactions on Microwave Theory and Techniques, 2010, pp. 1677-1685, vol. 58, No. 7.

Feipeng Wang, et.al., "An Improved Power-Added Efficiency 19-dBm Hybrid Envelope Elimination and Restoration Power Amplifier for 802.11g WLAN Applications", IEEE Transactions on Microwave Theory and Techniques, 2006, pp. 4086-4099, vol. 54, No. 12.

Shigeru Ando, "Electronic Circuit, from basics to system", Baifukan, pp. 144-145, 198-205, 212-213.

International Search Report of PCT/JP2013/051724, dated Mar. 19, 2013. [PCT/ISA/210].

* cited by examiner

TRANSMISSION APPARATUS AND TRANSMISSION METHOD

CROSS REFERENCE TO RELATED APPLICATIONS

This application is a National Stage of International Application No. PCT/JP2013/051724 filed Jan. 28, 2013, claiming priority based on Japanese Patent Application No. 2012-054398, filed Mar. 12, 2012, the contents of all of which are incorporated herein by reference in their entirety.

TECHNICAL FIELD

The present invention relates to a transmission apparatus and a transmission method, and more particularly to a transmission apparatus and a transmission method that are used for wireless communication and transmit RF (Radio Frequency) signals of a plurality of carrier frequency bands.

BACKGROUND ART

In the transmission apparatus used for wireless communication, a power amplifier (PA) that amplifies a RF signal to be transmitted consumes power most among the components of the transmission apparatus. Thus, in the development of the transmission apparatus, improving the power efficiency of the power amplifier (PA) is an important challenge. In recent communication standard, linear modulation is mainstream for spectral efficiency improvement. In the linear modulation, requirements concerning signal distortion are strict.

Thus, in the power amplifier (PA), to maintain linearity, average output power is set so that instantaneous maximum output (peak) power can be equal to or less than saturated output power. In other words, in the power amplifier (PA), as the ratio of the peak power of the signal to be amplified to average power (Peak-to-Average Ratio, hereinafter abbreviated to PAR) takes a larger value, to maintain the linearity, the average output power must be set lower than the saturated output power.

Generally, however, the power amplifier (PA) is characterized in that as the ratio of the average output power to the saturated output power is lower, the ratio (power efficiency) of supply power supplied to the power amplifier (PA) to output power extracted from the power amplifier (PA) is lower. The reduction of the power efficiency runs counter to energy saving.

The PAR of the RF signal has a unique value for each communication standard. In recently used high-speed wireless communication such as CDMA (Code Division Multiple Access), WLAN (Wireless Local Area Network), terrestrial digital broadcasting, or LTE (Long Term Evolution), the PAR takes a large value of several dB to tens of dB. Such a size of the PAR is a cause of great reduction of the power efficiency of the power amplifier (PA).

In the power amplifier (PA), to solve the problem of the reduction of the power efficiency caused by the low average output power, a polar modulation technology has been actively studied in recent years.

FIG. 1 illustrates the example of the power amplifier of an Envelope Tracking (ET) method that is a type of a polar modulation technology.

According to the ET method, transmission signal data is input to input terminal 401 of polar modulator 411, amplitude component signal 403 of the transmission signal data is output to output terminal 402 of polar modulator 411, and RF modulation signal 408 including the amplitude component and the phase component of the transmission signal data in the carrier wave is output to output terminal 407 of polar modulator 411. Polar modulator 411 has a function of individually setting the output timings of amplitude component signal 403 and RF modulation signal 408 to desired values.

Power supply modulator 404 outputs amplitude component signal 405 obtained by amplifying amplitude component signal 403, and modulates power supply terminal 409 of RF-PA (Radio Frequency Power Amplifier) 406 based on amplitude component signal 405. RF modulation signal 408 output to output terminal 407 of polar modulator 411 is input to RF-PA 406. RF modulation signal 410 that includes the amplitude component and the phase component of the transmission signal data in the carrier wave and that is amplified is output to output terminal 412 of RF-PA 406.

According to the ET method, the voltage of power supply terminal 409 of RF-PA 406 is controlled according to the amplitude of RF modulation signal 410. Particularly, when RF modulation signal 410 is low output power, the voltage of power supply terminal 409 of RF-PA 406 is accordingly reduced. Thus, wasteful power consumption can be suppressed by limiting the amount of supply power from power supply modulator 404 to RF-PA 406 to a necessary minimum during the low output power.

In recent communication standards, to achieve higher-speed wireless communication, as described in Non-patent Literature 1, a Carrier Aggregation (CA) technology collecting a plurality of fragmented bands to utilize has been used. In this CA technology, by bundling the plurality of bands to secure a broadband, a high transmission speed can be achieved.

In an inter-band Non-contiguous CA mode in which carrier frequencies are greatly different from each other (difference Δf between carrier frequencies is sufficiently larger than modulation bandwidth $f_{BB}$ of RF signal of each carrier), communication stability can be improved by simultaneously performing communication at a plurality of carrier frequencies whose propagation characteristics are different. By applying the CA technology, when a plurality of business operators intermittently allocates bands or when the plurality of business operators shares a band, corresponding communication can be performed.

In the wireless communication system using the CA technology, a transmission apparatus and a transmission method that transmit the RF signals of a plurality of bands are necessary. In such a transmission apparatus, similarly, improving of power efficiency is required.

FIG. 2 is a diagram illustrating the functional configuration of a transmission apparatus disclosed as a wireless communication machine in Patent Literature 1. The transmission apparatus illustrated in FIG. 2 has a function of transmitting the RF signals of a plurality of bands and a function of improving power efficiency by applying the polar modulation technology.

Specifically, in the transmission apparatus illustrated in FIG. 2, a modulation signal generated by modulation signal generator 61 is converted from the signal of an orthogonal coordinate system into the signal of a polar coordinate system at polar control unit 62, and separated into a PM signal having phase information and an AM signal having amplitude information. The separated PM signal is used for phase modulation for frequency generator 11 by PM control unit 63. Similarly, the AM signal is used for power supply modulation for PA 21 and PA 31 by power supply modulator 64. In other words, the polar modulation technology, for increasing or decreasing supply power from power supply modulator 64 to PA 21 and PA 31 according to the increase or decrease of the output power of PA 21 and PA 31, is applied. Thus, the reduction of the power efficiency, even in a high back-off state where average output power is low, can be suppressed.

The transmission apparatus illustrated in FIG. 2 includes path selection switches 14 and 41 for switching GSM (Global System for Mobile Communication) signal path 20 including PA 21 and UMTS (Universal Mobile Telecommunications System) signal path 30 including PA 31. PA 21 amplifies the RF signal of the carrier frequency $f_{c1}$ of a wireless communication system (GSM), while PA 31 amplifies the RF signal of the carrier frequency $f_{c2}$ of a wireless communication system (UMTS). When communication is performed at the wireless communication system of the carrier frequency $f_{c1}$, path selection switches 14 and 41 are switched so that PA 21 can input or output a RF signal based on a control signal from controller 15. When communication is performed at the wireless communication system of the carrier frequency $f_{c2}$, path selection switches 14 and 41 are switched so that PA 31 can input or output a RF signal based on a control signal from controller 15.

The transmission apparatus illustrated in FIG. 2, which is not compatible with the CA technology for simultaneously outputting two desired frequency components $f_{c1}$ and $f_{c2}$, has a multi-band operation function of operating for one frequency by temporally switching the frequency components $f_{c1}$ and $f_{c2}$.

As in the case of the transmission apparatus illustrated in FIG. 2, Patent Literatures 2~5 disclose technologies for maintaining high power efficiency even when average output power is set low by preparing the number of PAs equal to that of used bands, by allocating each PA for each band, by installing band selection switches on the input sides or the output sides of the PAs, by switching the band selection switches so that the PA corresponding to a currently used band can input or output a RF signal, and by applying a polar modulation technology for controlling supply power from a power source to each PA.

CITATION LIST

Patent Literature

Patent Literature 1: JP2006-324878 A
Patent Literature 2: JP2011-512098 A
Patent Literature 3: JP2005-244826 A
Patent Literature 4: JP2006-270923 A
Patent Literature 5: JP2008-205821 A Non-Patent Literature Non-patent Literature 1: Nobuhiko Mild, et. al., "Carrier Aggregation for achieving Broadband in LTE-Advanced-Advanced", NTT DoCoMo Technical Journal, Vol. 18, No. 2

Non-patent Literature 2: P. Conlantonio, et. al., "A Design technique for Concurrent Dual-Band Harmonic Tuned Power Amplifier, "IEEE Transactions on Microwave Theory and Techniques, Vol. 56, No. 11, pp. 2545 to 2555, 2008

Non-patent Literature 3: S. Kousai, et. al., "An Octave-Range, Watt-Level, Fully-Integrated CMOSS Switching Power Mixer Array for Linearization and Back-Off-Efficiency Improvement, "IEEE Journal of Solid-State Circuits, Vol. 44, No. 12, pp. 3376 to 3392, 2009

Non-patent Literature 4: P. Saad, et. al., "Design of a Highly Efficient 2-4 GHz Octave Bandwidth GaN-HEMT Power Amplifier, "IEEE Transactions on Microwave Theory and Techniques, Vo. 58, No. 7, pp. 1677 to 1685, 2010

Non-patent Literature 5: E Wang, et. al., "An improved Power-Added Efficiency 19-dBm Hybrid Envelope Elimination and Restoration Power Amplifier for 802.11g WLAN Applications, "IEEE Transactions on Microwave Theory and Techniques, Vol. 54, No. 12, pp. 4086 to 4099, 2006

Non-patent Literature 6: Shigeru Ando, "Electronic Circuit, from basics to system", Baifukan

SUMMARY OF INVENTION

Problems to be Solved

However, in the case of technologies described in Patent Literatures 1~5, the number of power amplifiers equal to that of used bands must be installed. This necessity causes, particularly in a wireless communication system using many bands, the increase of the circuit size and the costs of the transmission apparatus.

It is therefore an object of the present invention to provide a transmission apparatus and a transmission method capable of solving the aforementioned problems.

Solution to Problems

A transmission apparatus according to the present invention includes:

a polar modulator that generates a power supply modulation signal and RF (Radio Frequency) signals of a plurality of carrier frequency bands to be transmitted;

a power amplifier that amplifies the RF signals from the polar modulator; and a power supply modulator that modulates the power supply terminal of the power amplifier by a signal obtained by amplifying the power supply modulation signal from the polar modulator, wherein the power supply modulation signal is set based on a function using, as an argument, the power of the RF signal of each carrier frequency band output from the power amplifier.

A transmission method according to the present invention is a transmission method implemented in a transmission apparatus that generates RF signals of a plurality of carrier frequency bands to transmit the RF signals via a power amplifier, the transmission method comprising:

the step of detecting the power of the RF signal of each carrier frequency band output from the power amplifier;

the step of setting a power supply modulation signal based on a function using, as an argument, the detected power of the RF signal of each carrier frequency band; and the step of modulating the power supply terminal of the power amplifier by the power supply modulation signal output from a power supply modulator.

Effects of Invention

According to the transmission apparatus and the transmission method of the present invention, the RF signals of the plurality of carrier frequency bands are simultaneously amplified by the single power amplifier, and the power supply terminal of the power amplifier is modulated by the single power supply modulator. As a result, the circuit size and the costs of the transmission apparatus can be reduced.

DESCRIPTION OF EMBODIMENTS

Figure 1:
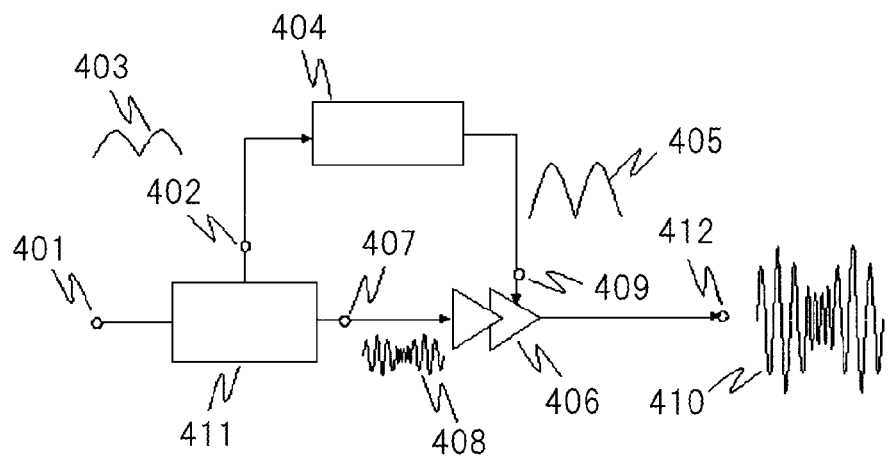
FIG. 1 A block diagram illustrating the block configuration of a transmission apparatus including a power amplifier to which a polar modulation technology is applied according to a related art.
Figure 2:
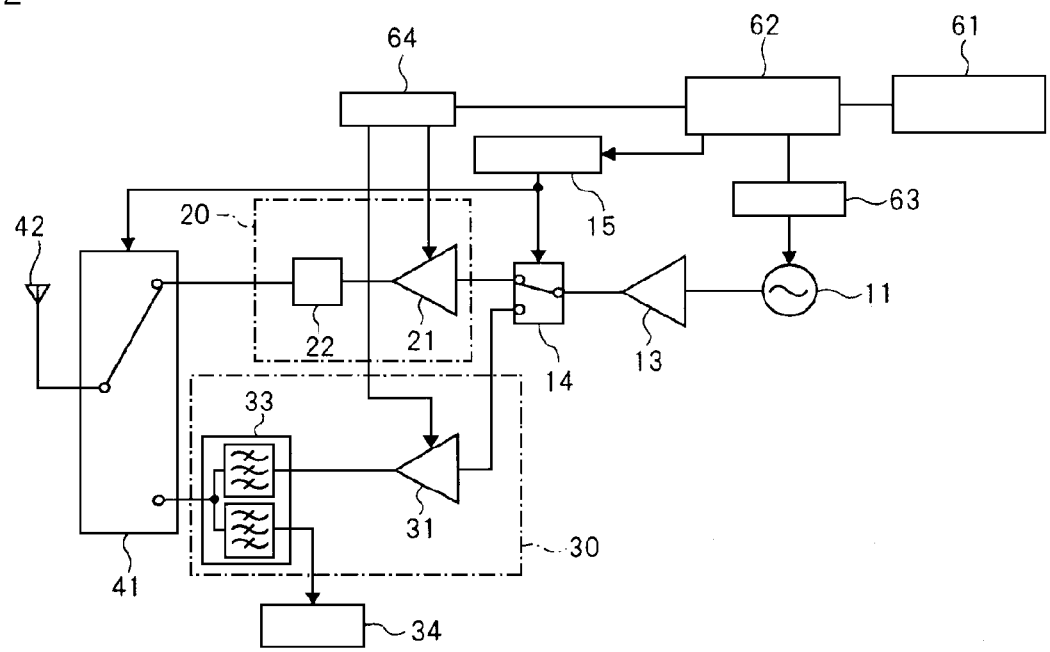
FIG. 2 A block diagram illustrating the block configuration of a transmission apparatus described in Patent Literature 1.

Hereinafter, the preferred exemplary embodiments of a transmission apparatus and a transmission method according to the present invention will be described with reference to the accompanying drawings. In the respective drawings referred to below, similar or equivalent portions will be denoted by similar reference numerals, and description thereof will not be repeated.

(Overview of Invention)

The overview of the present invention will be first given before description of the exemplary embodiments of the invention.

The present invention is mainly characterized by achieving a transmission apparatus that includes a power amplifier compatible with a CA (Carrier Aggregation) technology capable of simultaneously amplifying the signals of a plurality of frequencies generated by a signal generator.

Specifically, the transmission apparatus according to the present invention is mainly characterized by including a polar modulator that generates a power supply modulation signal and RF (Radio Frequency) signals of a plurality of carrier frequency bands to be transmitted, a power amplifier that amplifies the RF signals from the polar modulator, and a power supply modulator that modulates the power supply terminal of the power amplifier by a signal obtained by amplifying the power supply modulation signal from the polar modulator, and in that the power supply modulation signal is set based on a function using, as an argument, the power of the RF signal of each carrier frequency band output from the power amplifier.

Thus, in the transmission apparatus according to the present invention, since the RF signals of the plurality of carrier frequency bands are simultaneously amplified by one power amplifier, the number of power amplifiers can be one, irrespective of the number of RF signals of carrier frequencies to be amplified. In the transmission apparatus according to the present invention, since only one power amplifier is used, only one power supply modulator is necessary. In the transmission apparatus according to the present invention, compared with the transmission apparatuses described in Patent Literatures 1~5, the transmission apparatus of high power efficiency can be configured by the smaller numbers of power amplifiers and power supply modulators. As a result, a circuit size and costs can be reduced.

In the transmission apparatus according to the present invention, since the RF signals of the plurality of carrier frequency bands are simultaneously amplified by one power amplifier, there is no need to install a switch for switching a used frequency band at the input and the output of the power amplifier. As a result, in the transmission apparatus according to the present invention, the increase of the circuit size and the costs caused by the installation of such a switch and the reduction of the power efficiency of the entire transmission apparatus caused by the insertion loss of a switch can be prevented.

In the transmission apparatus according to the present invention, the RF signals of the plurality of carrier frequency bands can be simultaneously amplified to be output. Thus, the transmission apparatus according to the present invention is compatible with the CA technology.

First Exemplary Embodiment

Figure 3:
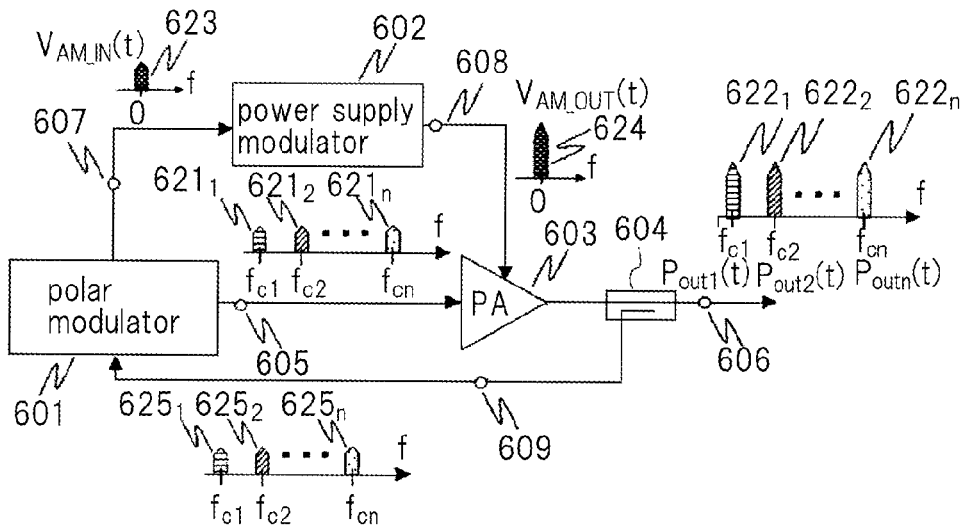
FIG. 3 A block diagram illustrating the block configuration of a transmission apparatus according to the first exemplary embodiment of the present invention.

FIG. 3 is a block diagram illustrating the block configuration of a transmission apparatus according to the first exemplary embodiment of the present invention. The transmission apparatus according to the first exemplary embodiment illustrated in FIG. 3 is configured by including at least polar modulator 601, power supply modulator 602, power amplifier 603, and coupler 604. Polar modulator 601 and power supply modulator 602 are connected to each other via terminal 607. Power supply modulator 602 and power amplifier 603 are connected to each other via terminal 608. Polar modulator 601 and power amplifier 603 are connected to each other via terminal 605. Coupler 604 is installed on the output side of power amplifier 603. Coupler 604 and polar modulator 601 are connected to each other via terminal 609.

Polar modulator 601 simultaneously generates RF signals $621_1, 621_2, \ldots, 621_n$ having different carrier frequencies $f_{c1}, f_{c2}, \ldots, f_{cn}$ to output them to terminal 605. RF signals $621_1, 621_2, \ldots, 621_n$ are input to power amplifier 603 via terminal 605. Power amplifier 605 amplifies input RF signals $621_1, 621_2, \ldots, 621_n$ to output them as RF signals $622_1, 622_2, \ldots, 622_n$ of carrier frequencies $f_{c1}, f_{c2}, \ldots, f_{cn}$ to terminal 606 via coupler 604.

In the exemplary embodiment, as power amplifier 603, a multiband power amplifier designed corresponding to the plurality of carrier frequencies $f_{c1}, f_{c2}, \ldots, f_{cn}$ is preferably used. For example, for power amplifier 603, a power amplifier designed for alignment between an input and an output by two or more frequencies, which is similar to that disclosed in Non-patent Literature 2 described in the aforementioned Non-patent Literature Section, can be used.

Alternatively, for power amplifier 603, a broadband power amplifier covering the frequency range of carrier frequencies $f_{c1}$ to $f_{cn}$ can be used. For the configuration of the broadband power amplifier, for example, a configuration disclosed in Non-patent Literature 3 or 4 described in the aforementioned Non-patent Literature Section can be employed.

Coupler 604 branches RF signals $622_1, 622_2, \ldots, 622_n$ output from power amplifier 603 to output them as RF signals $625_1, 625_2, \ldots, 625_n$ of carrier frequencies $f_{c1}, f_{c2}, \ldots, f_{cn}$ to terminal 609. To suppress the losses of RF signals $622_1, 622_2, \ldots, 622_n$, the powers of RF signals $625_1, 625_2, \ldots, 625_n$ branched by coupler 604 are preferably low. RF signals $625_1, 625_2, \ldots, 625_n$ are input to polar modulator 601 via terminal 609. Polar modulator 601 detects the instantaneous powers $P_{OUT1}(t), P_{OUT2}(t), \ldots, P_{OUTn}(t)$ of RF signals $622_1, 622_2, \ldots, 622_n$ based on input RF signals $625_1, 625_2, \ldots, 625_n$.

Polar modulator 601 outputs power supply modulation signal 623 to terminal 607. Voltage waveform $V_{AM\_IN}(t)$ of power supply modulation signal 623 is set based on a function using instantaneous powers $P_{OUT1}(t), P_{OUT2}(t), \ldots, P_{OUTn}(t)$ of RF signals $622_1, 622_2, \ldots, 622_n$ detected by polar modulator 601 as arguments.

Power supply modulation signal 623 output to terminal 607 is amplified by power supply modulator 602 to be output as power supply modulation signal 624 to terminal 608. The power supply voltage of power amplifier 603 is modulated by voltage waveform $V_{AM\_OUT}(t)$ of power supply modulation signal 624. Voltage waveform $V_{AM\_OUT}(t)$ of power supply modulation signal 624 is similarly set based on the function using instantaneous powers $P_{OUT1}(t), P_{OUT2}(t), \ldots, P_{OUTn}(t)$ of RF signals $622_1, 622_2, \ldots, 622_n$ detected as the arguments.

Thus, according to the exemplary embodiment, when instantaneous powers $P_{OUT1}(t), P_{OUT2}(t), \ldots, P_{OUTn}(t)$ of RF signals $622_1, 622_2, \ldots, 622_n$ output from power amplifier 603 are reduced, voltage waveform $V_{AM\_OUT}(t)$ of power supply modulation signal 624 is lowered to suppress a power supply from power supply modulator 602 to power amplifier 603. As a result, the power consumption of power amplifier 603 and the entire transmission apparatus are suppressed, and power efficiency can be improved.

As disclosed in Non-patent Literature 5 described in the aforementioned Non-patent Literature Section, generally, the broader band of the output voltage waveform of the power supply modulator creates problems such as the efficiency reduction of the power supply modulator and the increase of output signal errors. Thus, the operating band of the power supply modulator achievable by a current technology represented by that described in Non-patent Literature 5 is limited to several tens of MHz or lower.

In a current wireless communication system including the LTE-Advanced, the modulation bandwidth $f_{BB}$ of the RF signal of one carrier frequency is 20 MHz at the maximum. On the other hand, for example, in the Inter-band Non-contiguous CA mode used in the LTE-Advanced, a carrier frequency may be set to a band of 800 MHz and 2 GHz. Thus, a difference $\Delta f$ between carrier frequencies may be 1 GHz or higher.

In the exemplary embodiment, as described above, the output voltage waveform $V_{AM\_OUT}(t)$ of power supply modulation signal 624 is set based on the function using instantaneous powers $P_{OUT1}(t), P_{OUT2}(t), \ldots, P_{OUTn}(t)$ of RF signals $622_1, 622_2, \ldots, 622_n$ as the arguments. The band of instantaneous powers $P_{OUT1}(t), P_{OUT2}(t), \ldots, P_{OUT}$ is approximately equal to the modulation bandwidth $f_{BB}$ of each of RF signals $622_1, 622_2, \ldots, 622_n$, and set independently of the difference $\Delta f$ between the carrier frequencies. Accordingly, in the exemplary embodiment, an operating band necessary for power supply modulator 602 is approximately equal to the modulation bandwidth $f_{BB}$ of each of RF signals $622_1, 622_2, \ldots, 622_n$ without any dependence on the difference $\Delta f$ between the carrier frequencies. By the current technology represented by that described in Non-patent Literature 5, an operating band (several tens of MHz) higher than that (20 MHz at the maximum) necessary for power supply modulator 602 can be achieved. The power supply modulator based on the current technology represented by that described in Non-patent Literature 5 is a desirable form for power supply modulator 602.

In the polar modulation technology, when there is synchronous deviation between the transmission timing of RF signals $621_1, 621_2, \ldots, 621_n$ at input terminal 605 of power amplifier 603 and the transmission timing of power supply modulation signal 624 at power supply terminal 608 of power supply amplifier 603, signal distortion is generated in RF signals $622_1, 622_2, \ldots, 622_n$ at output terminal 606 of power amplifier 603. Thus, the transmission timings of RF signals $621_1, 621_2, \ldots, 621_n$ output from polar modulator 601 and the transmission timings of power supply modulation signal 624 are preferably set so to minimize the signal distortion of RF signals $622_1, 622_2, \ldots, 622_n$.

Next, a preferable method for setting the output voltage waveform $V_{AM\_OUT}(t)$ of power supply modulation signal 624 according to the exemplary embodiment will be described. For simpler description, a case where the number of carrier frequencies is two, namely, $f_{c1}$ and $f_{c2}$, will first be described.

Figure 4:
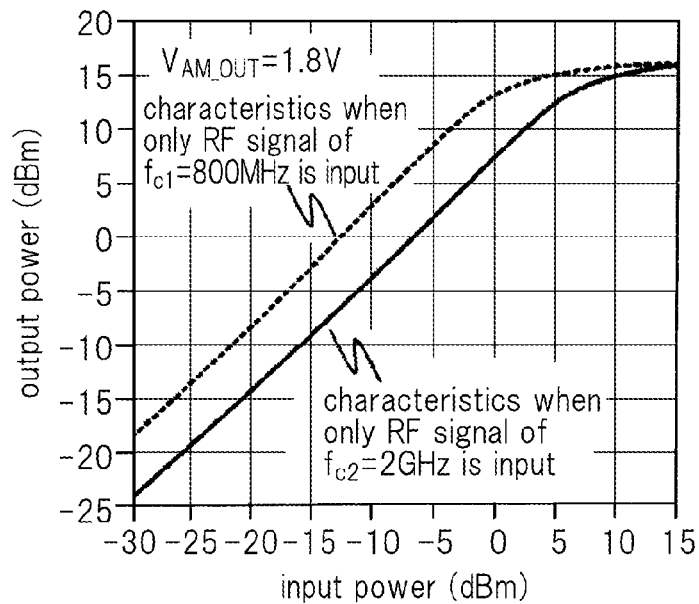
FIG. 4 A characteristic diagram illustrating the input-output power characteristics of a dual-band power amplifier (PA) as the example of a power amplifier illustrated in FIG. 3.

The setting method will be described by taking an example where a dual-band power amplifier (PA) corresponding to both carrier frequencies of 800 MHz and 2 GHz is used as power amplifier 603. FIG. 4 is a characteristic diagram illustrating the input-output power characteristics of the dual-band power amplifier (PA) as the example of power amplifier 603 illustrated in FIG. 3. A carrier frequency $f_{c1}$ is 800 MHz, and a carrier frequency $f_{c2}$ is 2 GHz. The power supply voltage (=output voltage $V_{AM\_OUT}(t)$ of power supply modulator 602) of power amplifier 603 is set to 1.8 V.

The characteristic diagram of FIG. 4 illustrates the input-output power characteristics of power amplifier 603 when only RF signal $621_1$ of the carrier frequency $f_{c1}$=800 MHz is input and the input-output power characteristics of power amplifier 603 when only RF signal $621_2$ of the carrier frequency $f_{c2}$=2 GHz is input. As illustrated in the characteristic diagram of FIG. 4, power amplifier 603 is designed to obtain approximately equal saturation output powers between when RF signal $621_1$ of the carrier frequency $f_{c1}$ is input and when RF signal $621_2$ of the carrier frequency $f_{c2}$ is input.

Figure 5:
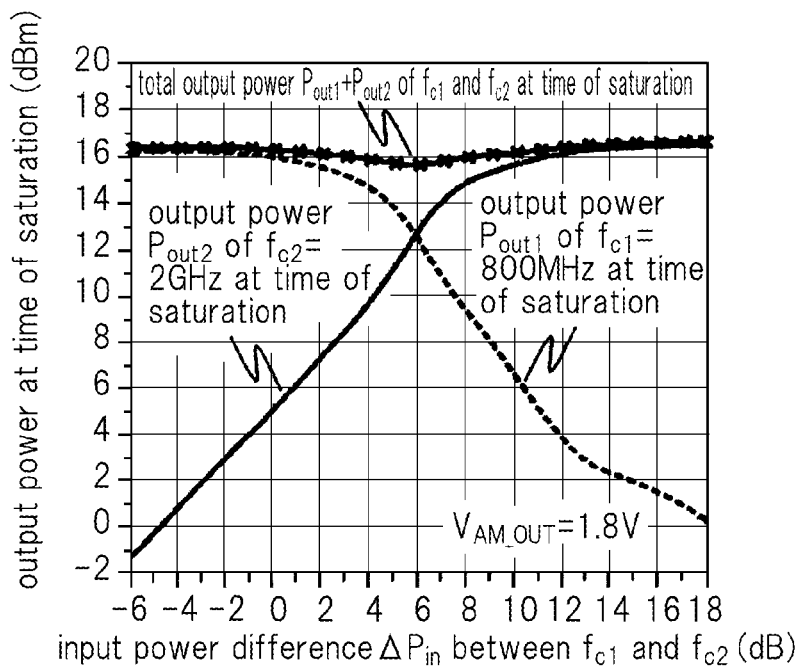
FIG. 5 A characteristic diagram illustrating the power characteristics of an output signal at the time of saturation when two RF signals of different carrier frequencies are simultaneously input to the dual-band power amplifier (PA) as the example of the power amplifier illustrated in FIG. 3.

FIG. 5 is a characteristic diagram illustrating the power characteristics of an output signal at the time of saturation when two RF signals of different carrier frequencies are simultaneously input to the dual-band power amplifier (PA) as the example of power amplifier 603 illustrated in FIG. 3. In other words, FIG. 5 is a graph plotting output power $P_{out1}$ of RF signal $622_1$ of a carrier frequency $f_1$ and output power $P_{out2}$ of RF signal $622_2$ of a carrier frequency $f_2$ at the time of saturation when RF signal $621_1$ of the carrier frequency $f_{c1}$=800 MHz and RF signal $621_2$ of the carrier frequency $f_{c2}$=2 GHz are simultaneously input. In the characteristic diagram of FIG. 5, the output power of power amplifier 603 at the time of saturation is plotted by changing a power difference $\Delta P_{in}=P_{in1}-P_{in2}$ (dB) between input power $P_{in1}$ of RF signal $621_1$ of the carrier frequency $f_{c1}$=800 MHz and input power $P_{in2}$ of RF signal $621_2$ of the carrier frequency $f_{c2}$=2 GHz. In the characteristic diagram of FIG. 5, the power supply voltage (=output voltage $V_{AM\_OUT}(t)$ of power supply modulator 602) of power amplifier 603 is set to 1.8 V.

When the ratio of the input power is changed between RF signal $621_1$ of the carrier frequency $f_{c1}$ and RF signal $621_2$ of the carrier frequency $f_{c2}$ by changing the power difference $\Delta P_{in}$ between the input powers, the output powers of RF signal $622_1$ of the carrier frequency $f_{c1}$ and RF signal $622_2$ of the carrier frequency $f_{c2}$ at the time of saturation also change according to the change of the ratio. Power amplifier 603 in the exemplary embodiment is designed so that the output voltages at the time of saturation of power amplifier 603 can take saturation output powers $P_{sat}$ of approximately equal values both when only RF signal $621_1$ of the carrier frequency $f_{c1}$ is used and when only RF signal $621_2$ of the carrier frequency $f_{c2}$ is used.

Thus, in the case of the power amplifier configured such that the saturation output powers at the time of the input of a single RF signal take equal values $P_{sat}$, as illustrated in FIG. 5, even when both RF signal $621_1$ of the carrier frequency $f_{c1}$ and RF signal $621_2$ of the carrier frequency $f_{c2}$ are simultaneously input, and the input power difference $\Delta P_{in}$ therebetween is changed, a result is obtained, specifically in which the output power total value $(P_{out1}+P_{out2})$ of the RF signals at the time of saturation is saturation output power $P_{sat}$, not changed from the time of the input of a single RF signal.

This result shows that when the RF signals of a plurality of greatly different carrier frequencies are simultaneously input to the power amplifier (Inter-band Noncontiguous CA mode), the total value of the output powers of the RF signals defines the saturation condition of the power amplifier (PA), irrespective of the input power difference $\Delta P_{in}$ between the RF signals of the carrier frequencies. In other words, the result shows that the power amplifier is saturated when the output power total value $(P_{out1}+P_{out2})$ of the RF signals reaches the saturation output power $P_{sat}$.

Figure 6:
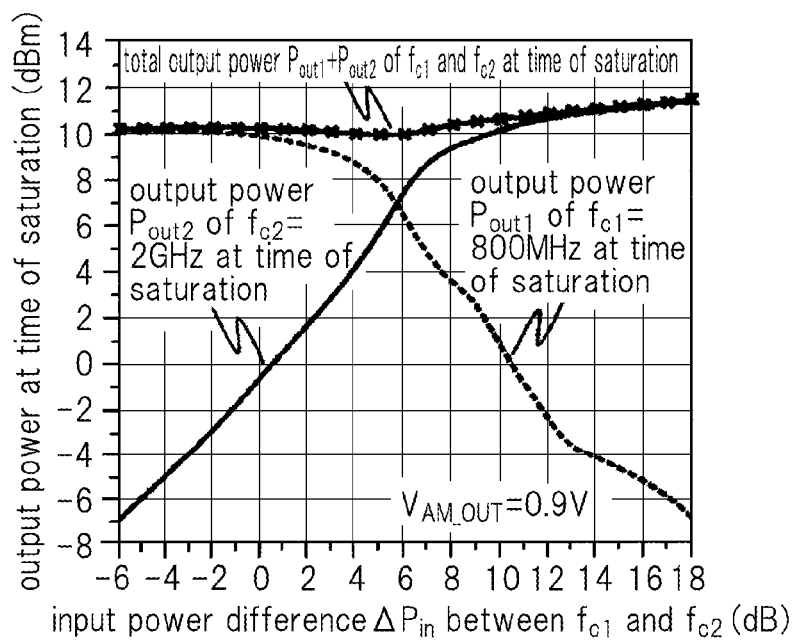
FIG. 6 A characteristic diagram illustrating the power characteristics of the output signal at the time of saturation when the two RF signals of different carrier frequencies are simultaneously input to the dual-band power amplifier (PA) as the example of the power amplifier illustrated in FIG. 3.

FIG. 6 is a characteristic diagram illustrating the power characteristics of the output signal at the time of saturation when the power supply voltage (=output voltage $V_{AM\_OUT}(t)$ of power supply modulator 602) of power amplifier 603 is set to 0.9, and the two RF signals ($f_{c1}$=800 HMz and $f_{c2}$=2 GHz) of different carrier frequencies are simultaneously input to power amplifier 603 as in the case illustrated in FIG. 5. With $V_{AM\_OUT}(t)$=0.9 V illustrated in FIG. 6, as in the case of $V_{AM\_OUT}(t)$=1.8 V illustrated in FIG. 5, irrespective of the input power difference $\Delta P_{in}$ between the RF signals of the carrier frequencies, a result is obtained, specifically in which the power amplifier is saturated when the output power total value $(P_{out1}+P_{out2})$ of the RF signals reaches the saturation output power $P_{sat}$.

According to the characteristic diagrams of FIGS. 5 and 6, the saturation output power $P_{sat}$ of power amplifier 603 is set to a fixed value not dependent on the input power difference $\Delta P_{in}$ between the RF signals of the carrier frequencies. However, the saturation output power $P_{sat}$ of power amplifier 603 is dependent on the value of the power supply voltage (=output voltage $V_{AM\_OUT}$ of power supply modulator 602) of power amplifier 603.

Figure 7:
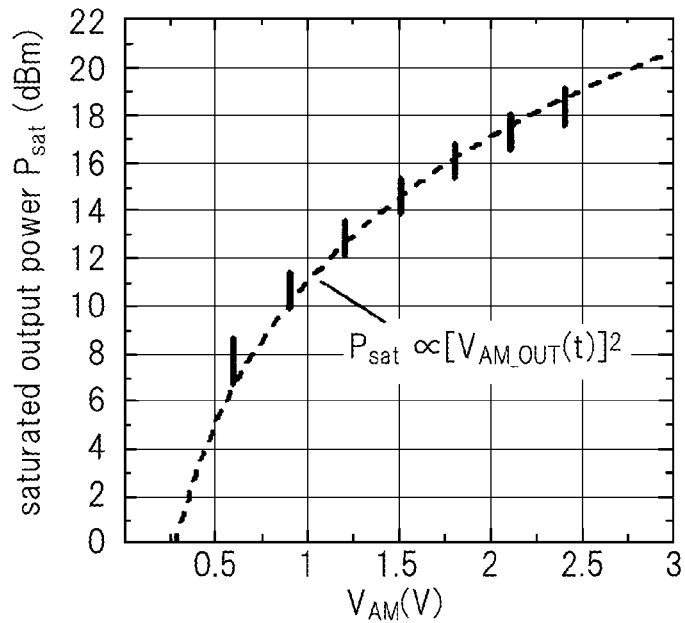
FIG. 7 A characteristic diagram illustrating a relationship between a saturation output and a power-supply voltage when the two RF signals of different carrier frequencies are simultaneously input to the dual-band power amplifier (PA) as the example of the power amplifier illustrated in FIG. 3.

FIG. 7 is a graph plotting a relationship between the saturation output power $P_{sat}$ of power amplifier 603 and the power supply voltage (=output voltage $V_{AM\_OUT}$ of power supply modulator 602) of power amplifier 603 when the two RF signals ($f_{c1}$=800 MHz and $f_{c2}$=2 GHz) of different carrier frequencies are simultaneously input to power amplifier 603 as in the case of those illustrated in FIGS. 5 and 6. In FIG. 7, the real saturation output power $P_{sat}$ of power amplifier 603 is indicated by a solid line. In FIG. 7, fitting based on the relational expression of $P_{sat} \propto V_{AM\_OUT}^2$ is indicated by a broken line. It is obvious from the characteristic diagram of FIG. 7 that the following relationship is established between the saturation output power $P_{sat}$ of power amplifier 603 and the power supply voltage (=output voltage $V_{AM\_OUT}$ of power supply modulator 602) of power amplifier 603 when the two RF signals ($f_{c1}$=800 MHz and $f_{c2}$=2 GHz) of different carrier frequencies are simultaneously input to power amplifier 603.

$$P_{sat} \propto (V_{AM\_OUT})^2 \quad \text{[Formula 1]}$$

The characteristic diagram of FIG. 7 illustrates the above relationship.

According to the polar modulation technology, by controlling the power supply voltage so that desired output power can always match the saturation power, the saturated state of high power efficiency is always achieved, irrespective of fluctuation in output power. Thus, in the exemplary embodiment, the output voltage $V_{AM\_OUT}(t)$ of power supply modulator 602 is preferably set so that power amplifier 603 can be always set in a saturated state. According to the result in which the saturation output power $P_{sat}$ is determined by the output power total value $(P_{out1}+P_{out2})$ of the RF signals and the result of Formula (1) thus obtained, desirable setting for the output voltage $V_{AM\_OUT}(t)$ of power supply modulator 602 is given by following Formula (2) using the instantaneous powers $P_{OUT1}(t)$ and $P_{OUT2}(t)$ of RF signals $622_1$ and $622_2$.

$$V_{AM\_OUT}(t)=C\sqrt{P_{sat}}=C\sqrt{P_{out1}(t)+P_{out2}(t)} \quad \text{[Formula 2]}$$

In Formula 2, C is a proportional constant. When a low proportional constant C is taken to set the power supply voltage $V_{AM\_OUT}$ of power amplifier 603 low, power efficiency tends to be improved while a gain is lowered. Conversely, when a large proportional constant C is taken to set the power supply voltage $V_{AM\_OUT}$ of power amplifier 603 high, a gain tends to be increased while power efficiency is lowered. The proportional constant C is preferably set according to desired characteristics.

Hereinafter, the effects of the exemplary embodiment will be described based on, as an example, the characteristics of power amplifier 603 when the RF signal of the carrier frequency $f_{c1}$=800 HMz and the RF signal of the carrier frequency $f_{c2}$=2 GHz are simultaneously input to power amplifier 603, and the output voltage $V_{AM\_OUT}(t)$ of power supply modulator 602 is set by Formula (2).

Figure 8:
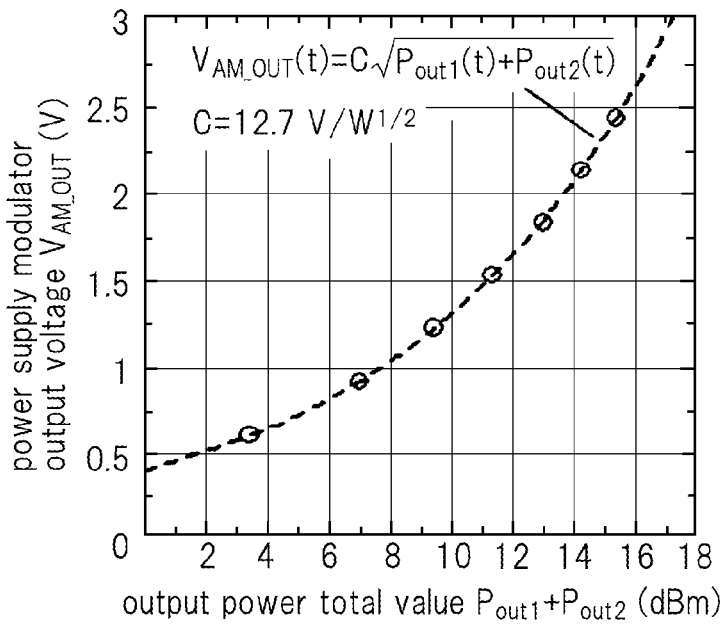
FIG. 8 A characteristic diagram illustrating the example of setting of a power supply voltage with respect to PA output power when the two RF signals of different carrier frequencies are input to the dual-band power amplifier (PA) as the example of the power amplifier illustrated in FIG. 3.
Figure 9:
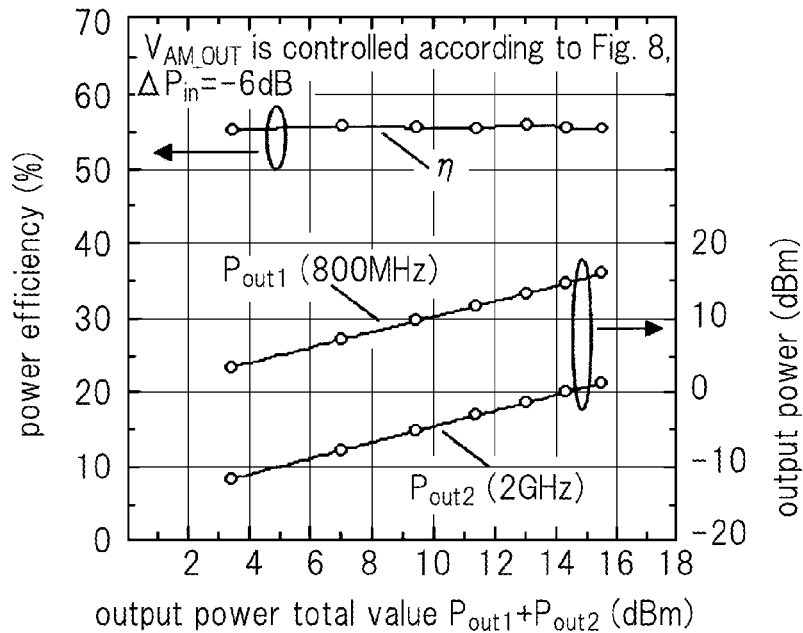
FIG. 9 A characteristic diagram illustrating PA output power and power efficiency when the two RF signals of different carrier frequencies are simultaneously input to the dual-band power amplifier (PA) as the example of the power amplifier illustrated in FIG. 3 and the PA is operated according to the setting of the power supply voltage illustrated in FIG. 8.

As a condition for obtaining the characteristics of power amplifier 603, a power difference $\Delta P_{in}=P_{in1}-P_{in2}$ (dB) between the input power $P_{in1}$ of RF signal $621_1$ of the carrier frequency $f_{c1}$=800 MHz and the input power $P_{in2}$ of RF signal $621_2$ of the carrier frequency $f_{c2}$=2 GHz is set to −6 dB. According to Formula 2, the output voltage $V_{AM\_OUT}(t)$ of power supply modulator 602 is set as illustrated in FIG. 8 with respect to the power total value $(P_{out1}+P_{out2})$ of RF signals $622_1$ and $622_2$ output from power amplifier 603. In FIG. 8, the proportional constant C (=12.7 VW$^{1/2}$) is selected so that a gain and power efficiency can be both within permissible ranges. The power efficiency η of power amplifier 603 and the power $P_{out1}$ and the power $P_{out2}$ of RF signals $622_1$ and $622_2$ output from power amplifier 603 under the condition illustrated in FIG. 8 are illustrated in FIG. 9. The power efficiency η is defined by Formula 3 using power $P_{AM}$ supplied from power modulator 602 to power amplifier 603 and the power $P_{out1}$ and the power $P_{out2}$ of RF signals $622_1$ and $622_2$.

$$\eta=(P_{out1}+P_{out2})/P_{AM} \quad \text{[Formula 3]}$$

As illustrated in FIG. 9, the power efficiency η of power amplifier 603 is maintained almost at a constant value even when the powers $P_{out1}$ and $P_{out2}$ of RF signals $622_1$ and $622_2$ are reduced by about 10 dB.

Figure 10:
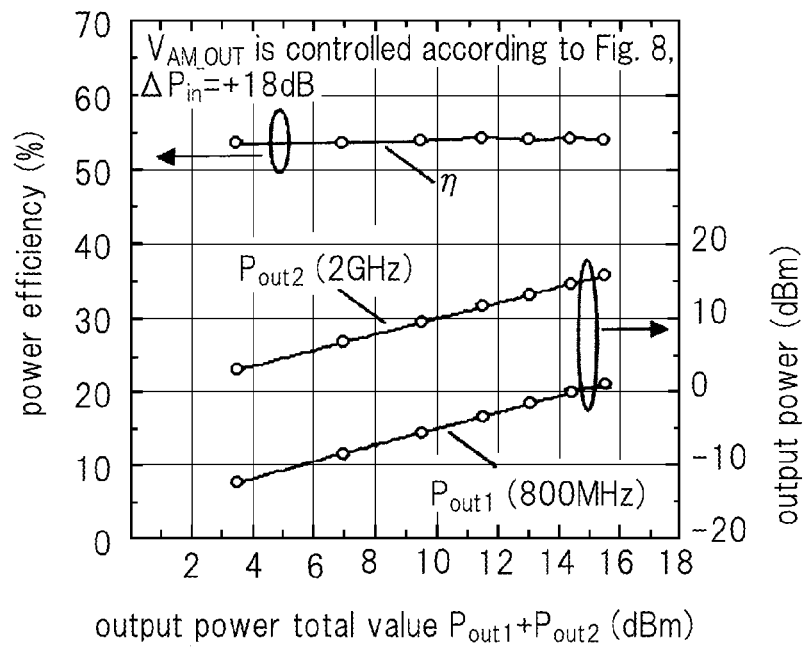
FIG. 10 A characteristic diagram illustrating PA output power and power efficiency when the two RF signals of different carrier frequencies are simultaneously input to the dual-band power amplifier (PA) as the example of the power amplifier illustrated in FIG. 3 and the PA is operated according to the setting of the power supply voltage illustrated in FIG. 8.

FIG. 10 illustrates the characteristics of power amplifier 603 when the power difference $\Delta P_{in}=P_{in1}-P_{in2}$ (dB) between input power $P_{in1}$ of RF signal $621_1$ and input power $P_{in2}$ of RF signal $621_2$ is changed from −6 dB to +18 dB, from the condition obtaining the result illustrated in FIG. 9. As in the case of $\Delta P_{in}$=−6 dB illustrated in FIG. 9, in the case of $\Delta P_{in}$=+18 dB illustrated in FIG. 10, the power efficiency η of power amplifier 603 is maintained almost at a constant value even when the powers $P_{out1}$ and $P_{out2}$ of RF signals $622_1$ and $622_2$ are reduced by about 10 dB. Thus, in the exemplary embodiment, irrespective of the value of the power difference $\Delta P_{in}$ between the RF signals of the carrier frequencies input to power amplifier 603, the power efficiency η of power amplifier 603 can be maintained high when the output power of power amplifier 603 is low.

Figure 11:
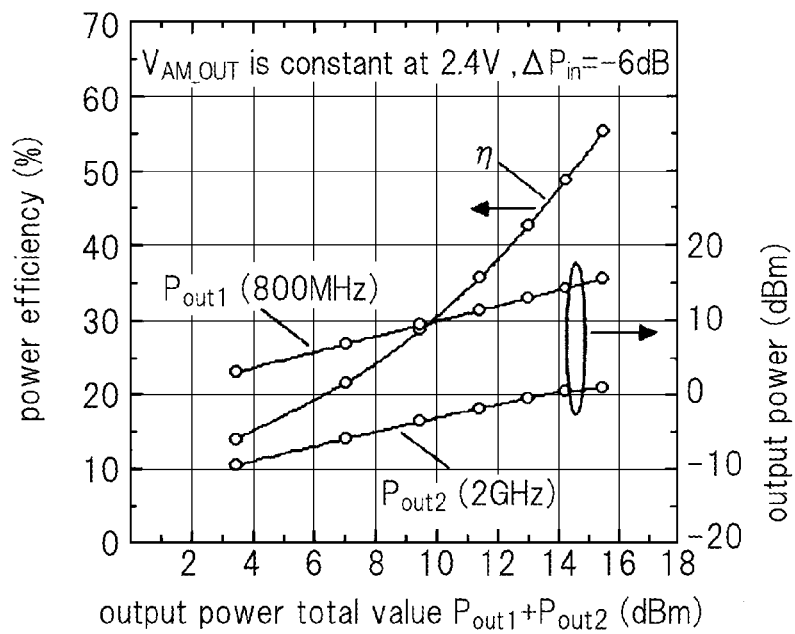
FIG. 11 A characteristic diagram illustrating PA output power and power efficiency when the two RF signals of different carrier frequencies are simultaneously input to the dual-band power amplifier (PA) as the example of the power amplifier illustrated in FIG. 3 and the PA is operated under constant power supply voltage.
Figure 12:
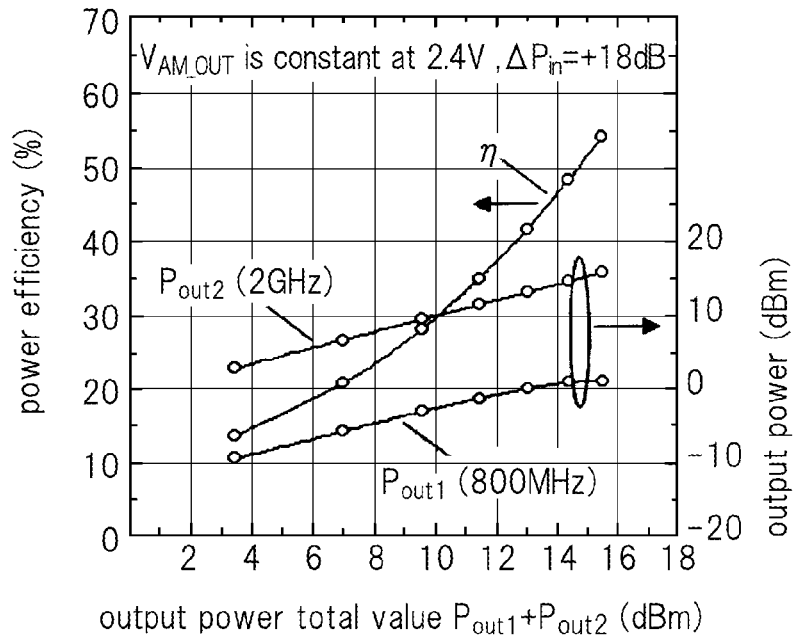
FIG. 12 A characteristic diagram illustrating PA output power and power efficiency when the two RF signals of different carrier frequencies are simultaneously input to the dual-band power amplifier (PA) as the example of the power amplifier illustrated in FIG. 3 and the PA is operated under constant power supply voltage.

As comparison targets, FIGS. 11 and 12 illustrate the characteristics of power amplifier 603 when the power supply voltage control of power amplifier 603 illustrated in FIG. 8 is not performed while the output voltage $V_{AM\_OUT}$ of power amplifier 603 is set to a fixed value (2.4 V). As a condition for obtaining the characteristics of power amplifier 603, a power difference $\Delta P_{in}$, between the input power $P_{in1}$ of RF signal $621_1$ of the carrier frequency $f_{c1}$=800 MHz and the input power $P_{in2}$ of RF signal $621_2$ of the carrier frequency $f_{c2}$=2 GHz, is set to $\Delta$Pin=−6 dB in FIG. 11 and is set to $\Delta$Pin=+18 dB in FIG. 12. In FIGS. 11 and 12, when the powers $P_{out1}$ and $P_{out2}$ of RF signals $622_1$ and $622_2$ are reduced by 10 dB, the power efficiency η is reduced to about ⅓ of a maximum value. As illustrated in FIGS. 11 and 12, when no power supply voltage control is performed, the power efficiency η is greatly reduced accompanying the reduction of the RF output powers $P_{out1}$ and $P_{out2}$ of power amplifier 603. The comparison of the power efficiency, when the power supply voltage control according to the exemplary embodiment is used as illustrated in FIGS. 9 and 10, with the power efficiency, when no power supply voltage control is used as illustrated in FIGS. 11 and 12, clearly shows that the power efficiency at the time of reduction of the RF output powers $P_{out1}$ and $P_{out2}$ of power amplifier 603 is improved by the power supply voltage control of the exemplary embodiment.

Figure 13:
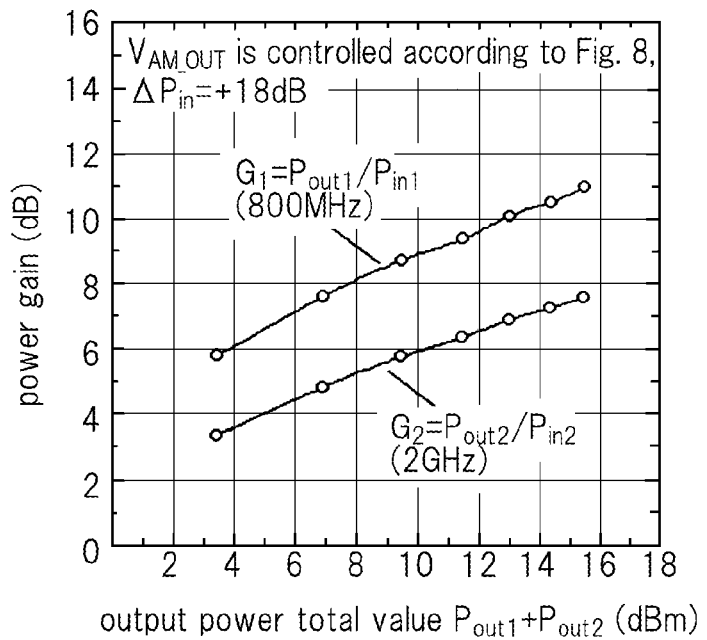
FIG. 13 A characteristic diagram illustrating a PA power gain when the two RF signals of different carrier frequencies are simultaneously input to the dual-band power amplifier (PA) as the example of the power amplifier illustrated in FIG. 3 and the PA is operated according to the setting of the power supply voltage illustrated in FIG. 8.

FIG. 13 illustrates power gains $G_1$ and $G_2$ at the respective carrier frequencies under the same condition as that for obtaining the result illustrated in FIG. 10, specifically, when the power supply voltage control of power amplifier 603 illustrated in FIG. 8 is performed and the power difference $\Delta P_{in}$, between the input power $P_{in1}$ of RF signal $621_1$ of the carrier frequency $f_{c1}$=800 MHz and the input power $P_{in2}$ of RF signal $621_2$ of the carrier frequency $f_{c2}$=2 GHz, is set to +18 dB. In the exemplary embodiment, the power supply voltage $V_{AM\_OUT}$ of power amplifier 603 is lowered accompanying the reduction of the RF output powers $P_{out1}$ and $P_{out2}$ of power amplifier 603. When the power supply voltage $V_{AM\_OUT}$ is lowered, the power gains $G_1$ and $G_2$ tend to be reduced.

The output voltage $V_{AM\_OUT}(t)$ of power supply modulator 602 in Formula (2) is desirable setting when two RF signals $621_1$ and $621_2$ of carrier frequencies are input to power amplifier 603. Desirable setting of the output voltage $V_{AM\_OUT}(t)$ of power supply modulator 602 when two or more RF signals $621_1, 621_2, \ldots, 621n$ of carrier frequencies are input to power amplifier 603 is expanded by Formula (4) below using the powers $P_{out1}(t), P_{out2}(t), \ldots, P_{outn}(t)$ of RF output signals $622_1, 622_2, \ldots, 622_n$.

$$V_{AM\_OUT}(t) \propto \sqrt{P_{sat}} = \sqrt{P_{out1}(t) + P_{out2}(t) + \ldots + P_{outn}(t)} \quad \text{[Formula 4]}$$

First Modified Example of First Exemplary Embodiment

Figure 14:
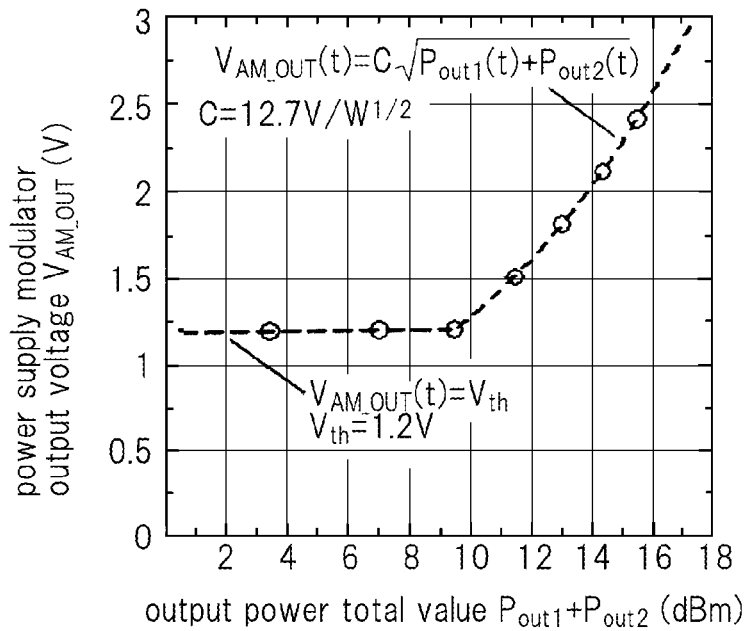
FIG. 14 A characteristic diagram illustrating the example of setting of a power supply voltage with respect to PA output power when the two RF signals of different carrier frequencies are input to the dual-band power amplifier (PA) as the example of the power amplifier illustrated in FIG. 3.

FIG. 14 illustrates the setting of the power supply voltage $V_{AM\_OUT}$ of power amplifier 603 according to the first modified example of the first exemplary embodiment of the present invention. To suppress the reduction of the power gains $G_1$ and $G_2$ when the RF output powers $P_{out1}$ and $P_{out2}$ of power amplifier 603 are reduced, the power supply voltage $V_{AM\_OUT}$ of power amplifier 603 can be set, for example, as illustrated in FIG. 14. In FIG. 14, the power supply voltage $V_{AM\_OUT}$ of power amplifier 603 is set by Formula (5) as shown below.

$$V_{AM\_OUT}(t) = \quad \text{[Formula 5]}$$

$$\begin{cases} C\sqrt{P_{out1}(t) + P_{out2}(t)} & (\text{if } C\sqrt{P_{out1}(t) + P_{out2}(t)} \geq V_{th}) \\ V_{th} & (\text{if } C\sqrt{P_{out1}(t) + P_{out2}(t)} \leq V_{th}) \end{cases}$$

Specifically, the power supply voltage $V_{AM\_OUT}$ is set to $C\sqrt{P_{out1}(t) + P_{out2}(t)}$ during a period where $P_{out1}(t) + P_{out2}(t) > (V_{th}/C)^2$ is satisfied. The power supply voltage $V_{AM\_OUT}$ is set to $V_{th}$ during a period where $P_{out1}(t) + P_{out2}(t) < (V_{th}/C)^2$ is satisfied.

In the case of $C\sqrt{P_{out1}(t) + P_{out2}(t)} = V_{th}$, an upper formula and a lower formula take equal values, and thus any of the two can be used.

In the setting of the power supply voltage $V_{AM\_OUT}$ illustrated in FIG. 14 and Formula 5, by preventing power supply voltage $V_{AM\_OUT}$ from being lower than the threshold value $V_{th}$ when the RF output powers $P_{out1}$ and $P_{out2}$ of power amplifier 603 are reduced, the reduction of the power gains $G_1$ and $G_2$ of power amplifier 603, caused by the reduction of the power supply voltage $V_{AM\_OUT}$, is suppressed.

Figure 15:
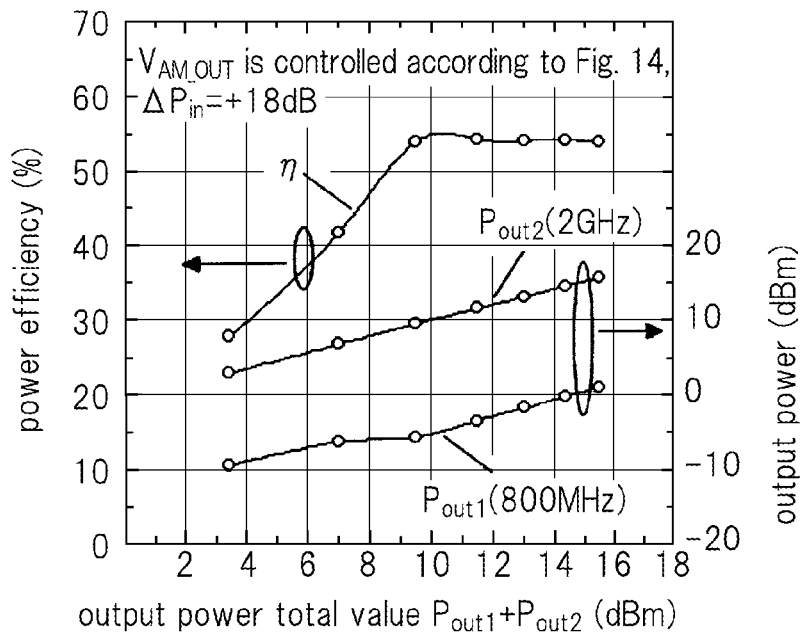
FIG. 15 A characteristic diagram illustrating PA output power and power efficiency when the two RF signals of different carrier frequencies are simultaneously input to the dual-band power amplifier (PA) as the example of the power amplifier illustrated in FIG. 3 and the PA is operated according to the setting of the power supply voltage illustrated in FIG. 14.
Figure 16:
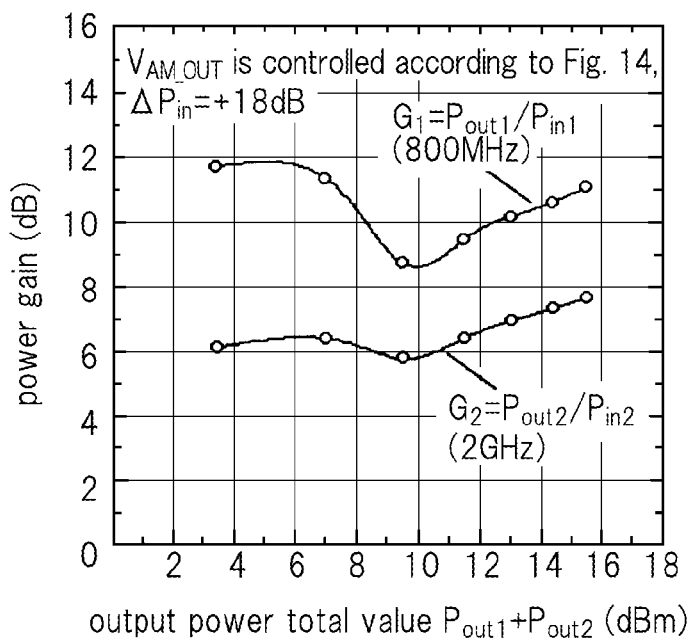
FIG. 16 A characteristic diagram illustrating a PA power gain when the two RF signals of different carrier frequencies are simultaneously input to the dual-band power amplifier (PA) as the example of the power amplifier illustrated in FIG. 3 and the PA is operated according to the setting of the power supply voltage illustrated in FIG. 14.

FIGS. 15 and 16 illustrate the characteristics of power amplifier 603 when power supply voltage control is performed according to the setting of the power supply voltage $V_{AM\_OUT}$ illustrated in FIG. 14 and Formula 5. The power supply voltage $V_{AM\_OUT}$ is maintained at the fixed value $V_{th}$ when the RF output powers $P_{out1}$ and $P_{out2}$ of power amplifier 603 are reduced. Thus, while the power efficiency η is slightly reduced as illustrated in FIG. 15, the reduction of the power gains $G_1$ and $G_2$ at the time of a low output can be suppressed as illustrated in FIG. 16.

Second Modified Example of First Exemplary Embodiment

Figure 17:
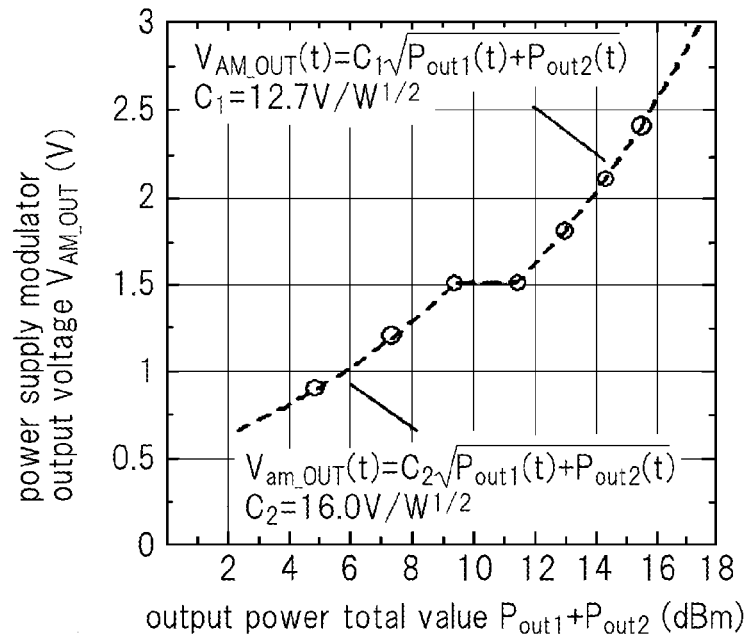
FIG. 17 A characteristic diagram illustrating the example of setting of a power supply voltage with respect to PA output power when the two RF signals of different carrier frequencies are input to the dual-band power amplifier (PA) as the example of the power amplifier illustrated in FIG. 3.

FIG. 17 illustrates the setting of the power supply voltage $V_{AM\_OUT}$ of power amplifier 603 according to the second modified example of the first exemplary embodiment of the present invention. To suppress the reduction of the power gains $G_1$ and $G_2$ when the RF output powers $P_{out1}$ and $P_{out2}$ of power amplifier 603 are reduced, the power supply voltage $V_{AM\_OUT}$ of power amplifier 603 can be set, for example, as illustrated in FIG. 17. In FIG. 17, the power supply voltage $V_{AM\_OUT}$ of power amplifier 603 is set by Formula (6) as shown below.

$$V_{AM\_OUT}(t) = \quad \text{[Formula 6]}$$

$$\begin{cases} C_2\sqrt{P_{out1}(t) + P_{out2}(t)} & (\text{if } P_{out1}(t) + P_{out2}(t) \leq P_{th2}) \\ C_2\sqrt{P_{th2}} \, (= C_1\sqrt{P_{th1}}) & (\text{if } P_{th2} \leq P_{out1}(t) + P_{out2}(t) \leq P_{th1}) \\ C_1\sqrt{P_{out1}(t) + P_{out2}(t)} & (\text{if } P_{th1} \leq P_{out1}(t) + P_{out2}(t)) \end{cases}$$

A middle formula indicates that $C_2\sqrt{P_{th2}}$ and $C_1\sqrt{P_{th2}}$ take equal values.

In the case of $P_{out1}(t)+P_{out2}(t)=P_{th2}$, an upper formula and the middle formula take equal values, and thus any of the two can be used. In the case of $P_{out1}(t)+P_{out2}(t)=P_{th1}$, the middle formula and a lower formula take equal values, and thus any of the two can be used.

In the setting of the power supply voltage $V_{AM\_OUT}$ illustrated in FIG. 17 and Formula 6, the value of the proportional constant $C_2$ at the time of low output power equal to or lower than the threshold value power $P_{th2}$ is preferably set equal to or higher than the proportional constant $C_1$ at the time of high output power equal to or higher than the threshold value power $P_{th1}$. By such setting of the proportional constants $C_1$ and C2, the power supply voltage $V_{AM\_OUT}$, at the time of low output power equal to or lower than the threshold value power $P_{th2}$, is slightly higher than that when a single proportional constant C is used as illustrated in FIG. 8, thus a power gain at the time of low output power slightly increases. The supply voltage $V_{AM\_OUT}$ is controlled even at the time of low output power equal to or lower than the threshold value power $P_{th2}$. Thus, the reduction of the power efficiency η at the time of low output power can be suppressed to a certain extent.

Figure 18:
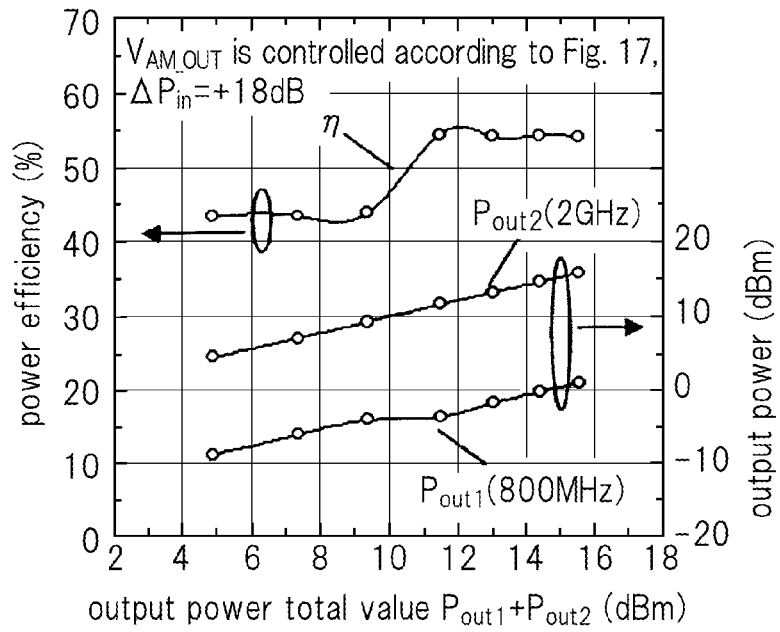
FIG. 18 A characteristic diagram illustrating PA output power and power efficiency when the two RF signals of different carrier frequencies are simultaneously input to the dual-band power amplifier (PA) as the example of the power amplifier illustrated in FIG. 3 and the PA is operated according to the setting of the power supply voltage illustrated in FIG. 17.
Figure 19:
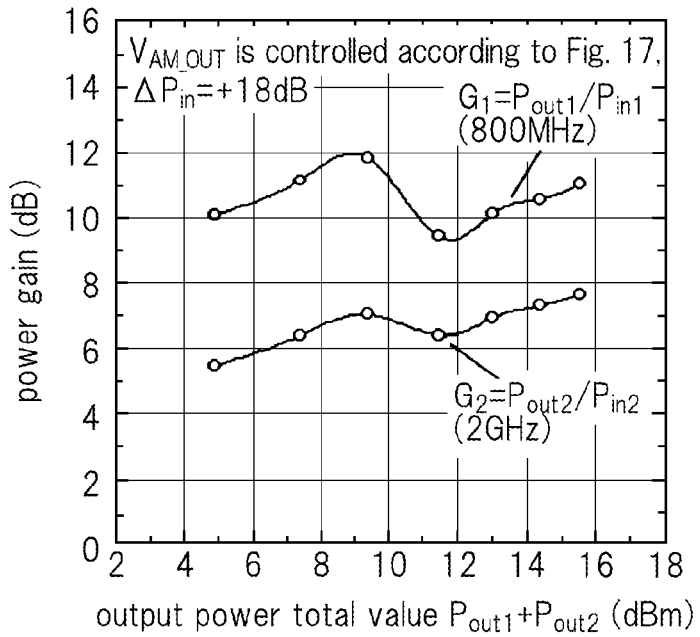
FIG. 19 A characteristic diagram illustrating a PA power gain when the two RF signals of different carrier frequencies are simultaneously input to the dual-band power amplifier (PA) as the example of the power amplifier illustrated in FIG. 3 and the PA is operated according to the setting of the power supply voltage illustrated in FIG. 17.

FIGS. 18 and 19 illustrate the characteristics of power amplifier 603 when power supply voltage control is performed according to the setting of the power supply voltage $V_{AM\_OUT}$ that is illustrated in FIG. 17 and Formula 6. As illustrated in FIG. 19, the reduction of the power gain is suppressed at the time of a low output power equal to or lower than the threshold value $P_{th2}$ (=9.4 dBm). The reduction of the power gain is achieved by increasing the value of the proportional constant C2, at the time of the low output power equal to or lower than the threshold value $P_{th2}$, to increase the power supply voltage $V_{AM\_OUT}$ of power amplifier 603. As illustrated in FIG. 18, the proportional coefficient of the power supply voltage $V_{AM\_OUT}$ of power amplifier 603 is switched from $C_1$ (=12.7 V/W$^{1/2}$) to $C_2$ (=16.0 VW$^{1/2}$) with respect to the threshold value power $P_{th1}$ (=11.4 dBm) to $P_{th2}$ (=9.4 dB). Accordingly, while the power efficiency η fluctuates within the same power range (=9.4 dBm~11.4 dBm), generally high power efficiency is maintained within all the power ranges because of the effect of the control of the power supply voltage $V_{AM\_OUT}$ of power amplifier 603.

In the setting of the power supply voltage $V_{AM\_OUT}$ illustrated in FIG. 17 and Formula 6, the two proportional coefficients C1 and C2 are switched for each power range. However, three or more proportional coefficients can be switched for each power range.

Third Modified Example of First Exemplary Embodiment

When a relationship between the saturation output power $P_{sat}$ of power amplifier 603 and the power supply voltage $V_{AM\_OUT}$ of power supply modulator 602 is given by Formula (1), desirable setting for the power supply voltage $V_{AM\_OUT}(t)$ of power supply modulator 602 is given by Formula (4). More generally, when the relationship between the saturation output power $P_{sat}$ of power amplifier 603 and the power supply voltage $V_{AM\_OUT}$ of power supply modulator 602 is given by a function f of Formula (7), desirable setting for the power supply voltage $V_{AM\_OUT}(t)$ of power supply modulator 602 is given by Formula (8) using the inverse function h(=f$^{-1}$) of the function f.

$P_{sat} \propto f(V_{AM})$     [Formula 7]

$V_{AM\_OUT}(t) \propto h(P_{sat})=h[P_{out1}(t)+P_{out2}(t)+ \ldots + P_{outn}(t)]$     [Formula 8]

The function h is defined by measuring the relationship between the saturation output power $P_{sat}$ of power amplifier 603 and the power supply voltage $V_{AM\_OUT}$ of power supply modulator 602. Alternatively, as the function h, the function illustrated in FIG. 14 and Formula (5) can be used, or the function illustrated in FIG. 17 and Formula (6) can be used. In other words, the function h can be arbitrarily set so as to obtain desired power efficiency and a desired gain.

Fourth Modified Example of First Exemplary Embodiment

Figure 20:
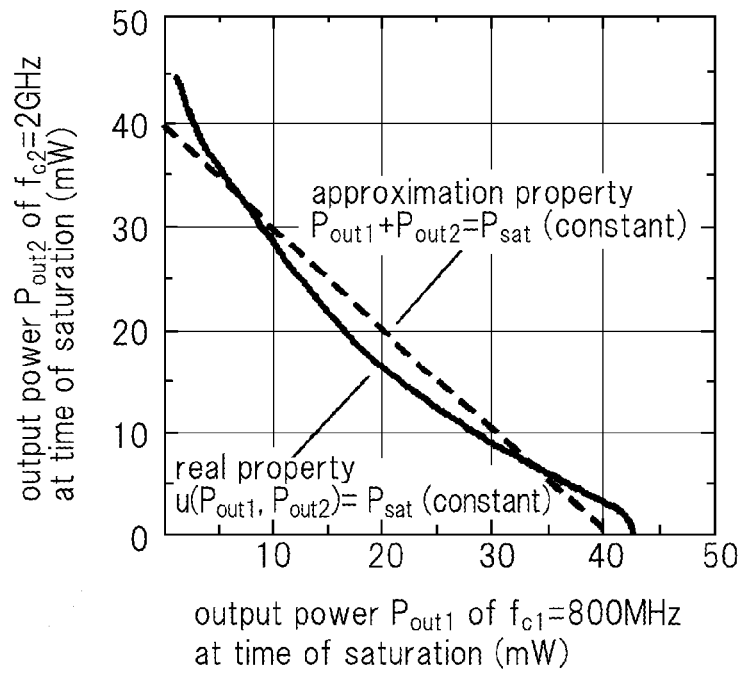
FIG. 20 A characteristic diagram illustrating an output signal at the time of saturation when the two RF signals of different carrier frequencies are simultaneously input to the dual-band power amplifier (PA) as the example of the power amplifier illustrated in FIG. 3.

FIG. 20 is a graph illustrating a relationship, in the dual-band power amplifier (PA) as the example of power amplifier 603 illustrated in FIG. 3, between the output power $P_{out1}$ of RF signal 622$_1$ of a carrier frequency fc$_1$ and the output power $P_{out2}$ of RF signal 622$_2$ of a carrier frequency fc$_2$ at the time of saturation when RF signal 621$_1$ of the carrier frequency $f_{c1}$=800 MHz and RF signal 621$_2$ of the carrier frequency $f_{c2}$=2 GHz are simultaneously input. In FIG. 20, displaying of the graph is changed while the same data as that illustrated in FIG. 5 is used.

As illustrated in the graph of FIG. 20, there is an approximate relationship defined in Formula (9) between the output power $P_{out1}$ of RF signal 622$_1$ of the carrier frequency $f_{c1}$ at the time of saturation and the output power $P_{out2}$ of RF signal 622$_2$ of the carrier frequency $f_{c2}$ at the time of saturation.

$P_{out1}+P_{out2}=P_{sat}(=const.)$     [Formula 9]

However, Formula (9) defines only the approximate relationship. The relationship between the output power $P_{out1}$ of RF signal 622$_1$ of the carrier frequency $f_{c1}$ at the time of saturation and the output power $P_{out2}$ of RF signal 622$_2$ of the carrier frequency $f_{c2}$ at the time of saturation based on real characteristics is represented by Formula (10) using an implicit function u as illustrated in the graph of FIG. 20.

$u(P_{out1},P_{out2})=P_{sat}(=const.)$     [Formula 10]

The implicit function u is defined based on the measured data of the output power $P_{out1}$ of RF signal 622$_1$ of the carrier frequency fc$_1$ at the time of saturation and the measured data of the output power $P_{out2}$ of RF signal 622$_2$ of the carrier frequency fc$_2$ at the time of saturation.

More generally, when two or more RF signals 621$_1$, 621$_2$, . . . , 621$_n$ of carrier frequencies are input to power amplifier 603, a relationship among the powers $P_{OUT1}(t), P_{OUT2}(t), \ldots, P_{OUTn}(t)$ of RF output signals 622$_1$, 622$_2$, . . . , 622$_n$ at the time of saturation is expanded as defined in Formula (11).

$u(P_{out1},P_{out2}, \ldots, P_{outn})=P_{sat}(=const.)$     [Formula 11]

By combining relational Formula (11) among the powers $P_{OUT1}(t), P_{OUT2}(t), \ldots, P_{OUTn}(t)$ of RF output signals 622$_1$, 622$_2$, . . . , 622$_n$ at the time of saturation with relational Formula (7) between the saturation output power $P_{sat}$ of power amplifier 603 and the output voltage $V_{AM\_OUT}$ of power supply modulator 602, the output voltage $V_{AM\_OUT}$ of power supply modulator 602 is set by Formula (12) as shown below.

$V_{AM\_OUT}(t) \propto f^{-1}(P_{sat})=f^{-1}[u(P_{out1}(t),P_{out2}(t), \ldots, P_{outn}(t))]=w[P_{out1}(t),P_{out2}(t), \ldots, P_{outn}(t)]$     [Formula 12]

A function w is a composite function of the function f$^{-1}$ and the function u. As discussed above, by setting the output voltage $V_{AM\_OUT}$ of power supply modulator 602 based on the general function w of the powers $P_{OUT1}(t)$, $P_{OUT2}(t), \ldots, P_{OUTn}(t)$ according to Formula (12), power amplifier 603 always operates in a saturated state, and high power efficiency can be obtained as a result.

Second Exemplary Embodiment

Next, a transmission apparatus according to the second exemplary embodiment of the present invention will be described with particular attention paid to a polar modulator in the transmission apparatus.

Figure 21:
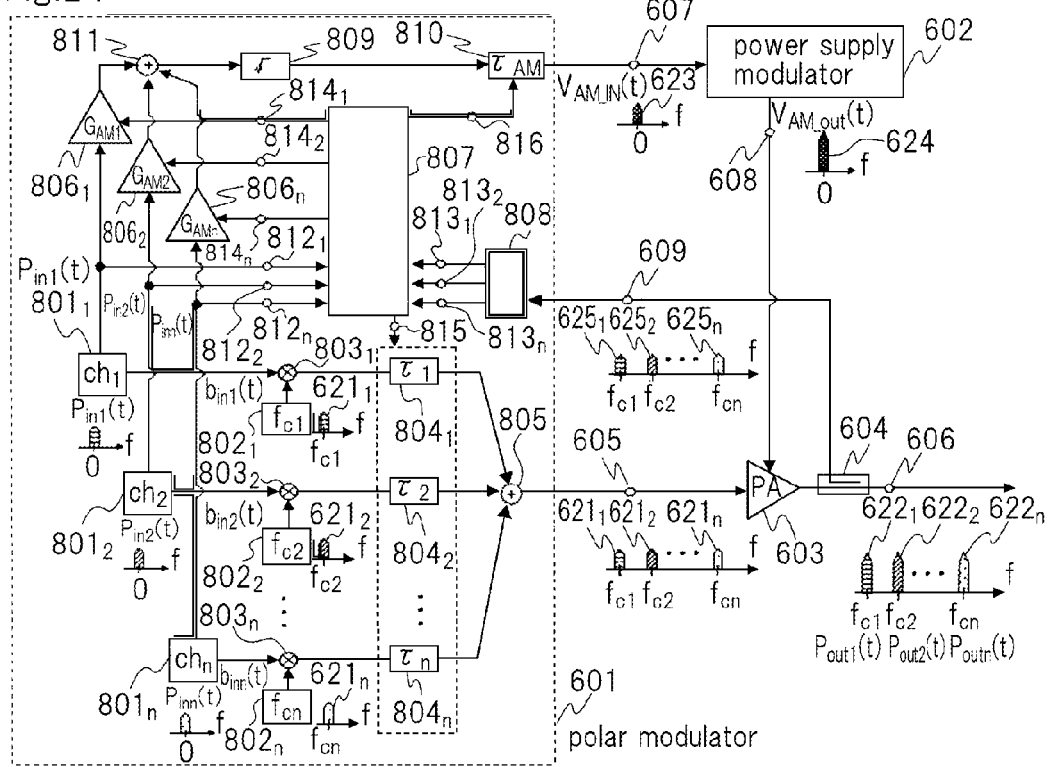
FIG. 21 A block diagram illustrating the block configuration of a polar modulator in a transmission apparatus according to the second exemplary embodiment of the present invention.

FIG. 21 illustrates the block configuration of the transmission apparatus according to the second exemplary embodiment of the present invention. In the transmission apparatus according to the second exemplary embodiment, power supply modulator 602, power amplifier 603, and coupler 604 are similar in configuration to those of the transmission apparatus of the first exemplary embodiment, and thus repeated description will be avoided.

In the transmission apparatus according to the second exemplary embodiment illustrated in FIG. 21, polar modulator 601 includes baseband signal generators $801_1$, $801_2, \ldots, 801_n$, local oscillation (LO) signal generators $802_1, 802_2, \ldots, 802_n$, mixers $803_1, 803_2, \ldots, 803_n$, RF signal delay adjusters $804_1, 804_2, \ldots, 804_n$, RF signal synthesizer 805, variable gain amplifiers (VGA) $806_1$, $806_2, \ldots, 806_n$, controller 807, branching filter 808, square root extractor 809, power modulation signal delay adjuster 810, and adder 811.

In polar modulator 601, baseband signal generators $801_1$ $801_2, \ldots, 801_n$ output baseband signals $b_{in1}(t)$, $b_{in2}(t), \ldots, b_{inn}(t)$ to mixers $803_1, 803_2, \ldots, 803_n$. Local oscillation (LO) signal generators $802_1, 802_2, \ldots, 802_n$ output the LO signals of carrier frequencies $f_{c1}, f_{c2}, \ldots, f_{cn}$, to mixers $803_1, 803_2, \ldots, 803_n$. Mixers $803_1, 803_2, \ldots, 803_n$ carries out frequency conversion (up conversion) of baseband signals $b_{in1}(t), b_{in2}(t), \ldots, b_{inn}(t)$ into carrier frequencies $f_{c1}, f_{c2}, \ldots, f_{cn}$ to generate RF signals $621_1$, $621_2, \ldots, 621_n$ of carrier frequencies $f_{c1}, f_{c2}, \ldots, f_{cn}$. RF signals $621_1, 621_2, \ldots, 621_n$ are input to RF signal synthesizer 805 via RF signal delay adjusters $804_1$, $804_2, \ldots, 804_n$, and RF signal synthesizer 805 outputs synthesized RF signals $621_1, 621_2, \ldots, 621_n$ to terminal 605. RF signal synthesizer 805 can include, for example, a broadband hybrid coupler usable within the range of carrier frequencies $f_{c1}, f_{c2}, \ldots, f_{cn}$.

RF signal delay adjusters $804_1, 804_2, \ldots, 804_n$, which are respectively arranged on the output sides of mixers $803_1$, $803_2, \ldots, 803_n$, can be installed on the input sides of mixers $803_1, 803_2, \ldots, 803_n$ instead.

Baseband signal generators $801_1$ $801_2, \ldots, 801_n$ input the powers $P_{in1}(t), P_{in2}(t), \ldots, P_{inn}(t)$ of baseband signals $b_{in1}(t), b_{in2}(t), \ldots, b_{inn}(t)$ to variable gain amplifiers (VGA) $806_1, 806_2, \ldots, 806_n$. Variable gain amplifiers (VGA) $806_1$, $806_2, \ldots, 806_n$, which respectively have gains $G_{AM1}$, $G_{AM2}, \ldots, G_{AMn}$, amplify the input powers $P_{in1}(t)$, $P_{in2}(t), \ldots, P_{inn}(t)$ to $G_{AM1}P_{in1}(t)$, $G_{AM2}P_{in2}(t), \ldots$, $G_{AMn}P_{inn}(t)$ to output the results to adder 811. Variable gain amplifiers (VGA) $806_1, 806_2, \ldots, 806_n$, which are not always required to have gains of 0 dB or higher, can be replaced with variable attenuators.

Variable gain amplifiers (VGA) $806_1, 806_2, \ldots, 806_n$ respectively include gain control terminals $814_1$, $814_2, \ldots, 814_n$. The gains $G_{AM1}, G_{AM2}, \ldots, G_{AMn}$ of variable gain amplifiers (VGA) $806_1, 806_2, \ldots, 806_n$ are set based on control signals output from controller 807 to gain control terminals $814_1, 814_2, \ldots, 814_n$.

Adder 811 outputs $G_{AM1}P_{in1}(t)+G_{AM2}P_{in2}(t)+ \ldots + G_{AMn}P_{inn}(t)$ that are additional values of the input signals to square root extractor 809. Adder 811 can include, for example, an operation amplifier according to a method disclosed in Chapter 5 of Non-patent Literature 6 described in the section of Non-patent Literature.

The power gains of the transmission apparatus in paths from baseband signal generators $801_1$ $801_2, \ldots, 801_n$ to output terminal 606 of power amplifier 603 via input terminal 605 of power amplifier 603 are defined as $G_{RF1}=P_{out1}/P_{in1}$, $G_{RF2}=P_{out2}/P_{in2}, \ldots, G_{RFn}=P_{outn}/P_{inn}$. Particularly, in an Inter-band Non-contiguous CA mode in which carrier frequencies are greatly different from each other (difference Δf between carrier frequencies is sufficiently larger than modulation bandwidth $f_{BB}$ of RF signal of each carrier), the influence of the frequency dependency of the power gains is large, and a large difference is generated in value among the power gains $G_{RF1}, G_{RF2}, \ldots, G_{RFn}$.

At this time, the power gains $G_{RF1}, G_{RF2}, \ldots, G_{RFn}$ of the transmission apparatus preferably have a relationship defined by Formula (13) below with the gains $G_{AM1}$, $G_{AM2}, \ldots, G_{AMn}$ of variable gain amplifiers (VGA) $806_1$, $806_2, \ldots, 806_n$.

$$G_{RF1}:G_{RF2}:\ldots:G_{RFn}=G_{AM1}:G_{AM2}:\ldots:G_{AMn} \quad \text{[Formula 13]}$$

Formula (13) is equivalent to following Formula (14).

$$P_{out1}:P_{out2}:\ldots:P_{outn}=G_{AM1}P_{in1}:G_{AM2}P_{in2}:\ldots:G_{AMn}P_{inn} \quad \text{[Formula 14]}$$

According to the second exemplary embodiment of the present invention, by controlling the gains of variable gain amplifiers (VGA) $806_1, 806_2, \ldots, 806_n$ via controller 807, the gains $G_{AM1}, G_{AM2}, \ldots, G_{AMn}$ are set to satisfy the relationship of Formula 13 or 14. At this time, the signal $G_{AM1}P_{in1}(t)+G_{AM2}P_{in2}(t)+ \ldots +G_{AMn}P_{inn}(t)$ output from adder 811 to square root extractor 809 is proportional to $P_{out1}(t)+P_{out2}(t)+ \ldots +P_{outn}(t)$.

By the aforementioned setting of the gains $G_{AM1}$, $G_{AM2}, \ldots, G_{AMn}$, even when the power gains $G_{RF1}$, $G_{RF2}, \ldots, G_{RFn}$ of the transmission apparatus are frequency-dependent, the sum total $P_{out1}(t)+P_{out2}(t)+ \ldots +P_{outn}(t)$ of the output powers is correctly calculated from input powers $P_{in1}+P_{in2}(t)+ \ldots +P_{inn}(t)$. This is particularly effective in the Inter-band Non-contiguous CA mode in which the influence of the frequency dependency of the power gains of the transmission apparatus is large.

Square root extractor 809 outputs $\text{sqrt}[G_{AM1}P_{in1}(t)+ G_{AM2}P_{in2}(t)+ \ldots +G_{AMn}P_{inn}(t)]$ that is a square root of the input signal $G_{AM1}P_{in1}(t)+G_{AM2}Pi_{n2}(t)+ \ldots +G_{AMn}P_{inn}(t)$ as power supply modulation signal 623 to terminal 607 via power supply modulation signal delay adjuster 810. Square root extractor 809 can include, for example, an IC multiplier according to a method disclosed in Chapter 7 of Non-patent Literature 6 described in the section of Non-patent Literature.

As described above, when the gains $G_{AM1}, G_{AM2}, \ldots$, $G_{AMn}$ are set to satisfy the relationship of Formula 13 or 14, power supply modulation signal 623 output to terminal 607 is a signal proportional to $\text{sqrt}[P_{out1}(t)+P_{out2}(t)+ \ldots + P_{outn}(t)]$. Power supply modulation signal 623 is amplified by power supply modulator 602 to be output as the output voltage $V_{AM\_OUT}(t)$ of power supply modulator 602 to terminal 608. By this operation, in the second exemplary embodiment of the present invention, as in the case of the first exemplary embodiment, the output voltage $V_{AM\_OUT}(t)$ of power supply modulator 602 is set as defined in Formula (4).

Hereinafter, the function of controller 807 will be described in detail. The powers $P_{in1}(t)$, $P_{in2}(t)$, ..., $P_{inn}(t)$ of baseband signals $b_{in1}(t)$, $b_{in2}(t)$, ..., $b_{inn}(t)$ are input to input terminals $812_1$, $812_2$, ..., $812_n$ of controller 807.

RF signals $625_1$, $625_2$, ..., $625_n$ of carrier frequencies $f_{c1}$, $f_{c2}$, ..., $f_{cn}$, output to terminal 609 via coupler 604 installed on the output side of power amplifier 603, are input to branching filter 808. Branching filter 808 has a function of separately outputting the RF signals of different carrier frequencies to different output terminals. In other words, branching filter 808 separately outputs RF signals $625_1$, $625_2$, ..., $625_n$ to different input terminals $813_1$, $813_2$, ..., $813_n$. Controller 807 calculates, based on RF signals $625_1$, $625_2$, ..., $625_n$ input to different input terminals $813_1$, $813_2$, ..., $813_n$, the powers $P_{OUT1}(t)$, $P_{OUT2}(t)$, ..., $P_{OUTn}(t)$ of RF signals $622_1$, $622_2$, ..., $622_n$ output from power amplifier 603.

By the aforementioned operation, controller 807 detects the input powers $P_{in1}(t)$, $P_{in2}(t)$, ..., $P_{inn}(t)$ and the output powers $P_{OUT1}(t)$, $P_{OUT2}(t)$, ..., $P_{OUTn}(t)$ of the transmission apparatus. Controller 807 detects the power gains $G_{RF1}=P_{out1}/P_{in1}$, $G_{RF2}=P_{out2}/P_{in2}$, ..., $G_{RFn}=P_{outn}/P_{inn}$ of the transmission apparatus from the detected input and output powers. Controller 807 calculates desired values of the gains $G_{AM1}$, $G_{AM2}$, ..., $G_{AMn}$ of variable gain amplifiers (VGA) $806_1$, $806_2$, ..., $806_n$ based on the power gains $G_{RF1}$, $G_{RF2}$, ..., $G_{RFn}$ of the transmission apparatus detected in the aforementioned operation and Formula (13) or (14). Controller 807 outputs control signals to gain control terminals $814_1$, $814_2$, ..., $814_n$ so that the gains $G_{AM1}$, $G_{AM2}$, ..., $G_{AMn}$ of variable gain amplifiers (VGA) $806_1$, $806_2$, ..., $806_n$ can be set to the desired values calculated in the aforementioned operation.

In the second exemplary embodiment of the present invention, as in the case of the first exemplary embodiment, the transmission timings of RF signals $621_1$, $621_2$, ..., $621_n$ output from polar modulator 601 and power supply modulation signal 624 are set so to minimize the signal distortion of RF signals $622_1$, $622_2$, ..., $622_n$. In the second exemplary embodiment, the transmission timings of RF signals $621_1$, $621_2$, ..., $621_n$ and power supply modulation signal 624 are set based on signal delay time at RF signal delay adjusters $804_1$, $804_2$, ..., $804_n$ and power modulation signal delay adjuster 810. Controller 807 detects the signal distortion of RF signals $622_1$, $622_2$, ..., $622_n$ based on RF signals $625_1$, $625_2$, ..., $625_n$ input to terminals $813_1$, $813_2$, ..., $813_n$. Controller 807 has a function of setting the signal delay time at RF signal delay adjusters $804_1$, $804_2$, ..., $804_n$ and power modulation signal delay adjuster 810 so to minimize the detected signal distortion of RF signals $622_1$, $622_2$, ..., $622_n$. The signal delay time at RF signal delay adjusters $804_1$, $804_2$, ..., $804_n$ is set based on a control signal output from controller 807 to control terminal 815. The signal delay time at power modulation signal delay adjuster 810 is set based on a control signal output from controller 807 to control terminal 816.

Through the measurement of a given period based on the aforementioned operation, the optimal values of the gains $G_{AM1}$, $G_{AM2}$, ..., $G_{AMn}$ of variable gain amplifiers (VGA) $806_1$, $806_2$, ..., $806_n$, and the signal delay time at RF signal delay adjusters $804_1$, $804_2$, ..., $804_n$ and power modulation signal delay adjuster 810 are calculated. The gains and the signal delay time can be fixed at the calculated optimal values, or updated again after appropriate time.

Figure 22:
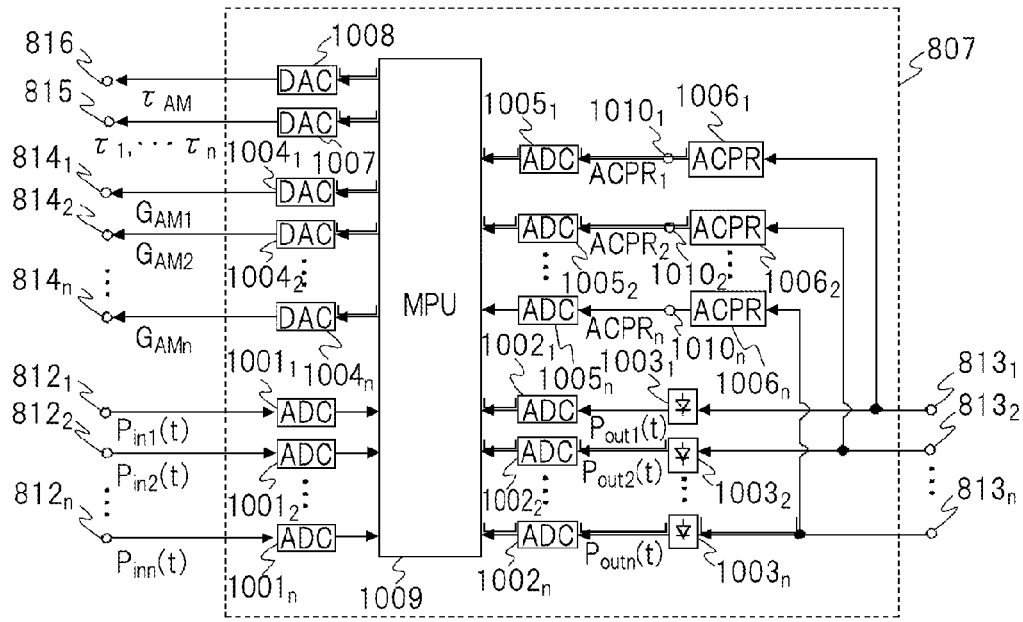
FIG. 22 A block diagram illustrating the block configuration of a controller in the transmission apparatus according to the second exemplary embodiment of the present invention.

FIG. 22 is a block diagram illustrating the internal configuration of controller 807. As illustrated in FIG. 22, controller 807 includes at least analog digital converters (ADC) $1001_1$, $1001_2$, ..., $1001_n$, $1002_1$, $1002_2$, ..., $1002_n$, and $1005_1$, $1005_2$, ..., $1005_n$, digital analog converters (DAC) $1004_1$, $1004_2$, ..., $1004_n$, 1007, and 1008, square-law detectors $1003_1$, $1003_2$, ..., $1003_n$, adjacent channel leakage power radio (ACPR) detectors $1006_1$, $1006_2$, ..., $1006_n$, and micro processor unit (MPU) 1009. MPU 1009 can be mounted in a digital signal processor (DSP) or a field programmable gate array (FPGA).

In controller 807 illustrated in FIG. 22, the data of the powers $P_{in1}(t)$, $P_{in2}(t)$, ..., $P_{inn}(t)$ of baseband signals $b_{in1}(t)$, $b_{in2}(t)$, ..., $b_{inn}(t)$ is input to input terminals $812_1$, $812_2$, ..., $812_n$. The powers $P_{in1}(t)$, $P_{in2}(t)$, ..., $P_{inn}(t)$ are converted into digital signals at ADCs $1001_1$, $1001_2$, ..., $1001_n$, to be input to MPU 1009. Alternatively, in controller 807, by omitting ADCs $1001_1$, $1001_2$, ..., $1001_n$, the data of the powers $P_{in1}(t)$, $P_{in2}(t)$, ..., $P_{inn}(t)$ can be transferred by digital signals from baseband signal generators $801_1$, $801_2$, ..., $801_n$ to MPU 1009.

In controller 807 illustrated in FIG. 22, RF signals $625_1$, $625_2$, ..., $625_n$ are input to input terminals $813_1$, $813_2$, ..., $813_n$. Square-law detectors $1003_1$, $1003_2$, ..., $1003_n$ output the powers $P_{OUT1}(t)$, $P_{OUT2}(t)$, ..., $P_{OUTn}(t)$ of RF signals $622_1$, $622_2$, ..., $622_n$ calculated based on RF signals $625_1$, $625_2$, ..., $625_n$ to ADCs $1002_1$, $1002_2$, ..., $1002_n$. The powers $P_{OUT1}(t)$, $P_{OUT2}(t)$, ..., $P_{OUTn}(t)$ are converted into digital signals at ADCs $1002_1$, $1002_2$, ..., $1002_n$, to be input to MPU 1009.

MPU 1009 calculates power gains $G_{RF1}=P_{out1}/P_{in1}$, $G_{RF2}=P_{out2}/P_{in2}$, ..., $G_{RFn}=P_{outn}/P_{inn}$ of the transmission apparatus at carrier frequencies $f_{c1}$, $f_{c2}$, ..., $f_{cn}$ from the aforementioned input power data, in other words, the powers $P_{in1}(t)$, $P_{in2}(t)$, ..., $P_{inn}(t)$ of the baseband signals $b_{in1}(t)$, $b_{in2}(t)$, ..., $b_{inn}(t)$ and the powers $P_{OUT1}(t)$, $P_{OUT2}(t)$, ..., $P_{OUTn}(t)$ of RF signals $622_1$, $622_2$, ..., $622_n$. MPU 1009 calculates desired values of the gains $G_{AM1}$, $G_{AM2}$, ..., $G_{AMn}$ of variable gain amplifiers (VGA) $806_1$, $806_2$, ..., $806_n$ based on the calculated power gains $G_{RF1}$, $G_{RF2}$, ..., $G_{RFn}$ and Formula (13).

MPU 1009 outputs control signals to gain control terminals $814_1$, $814_2$, ..., $814_n$ of variable gain amplifiers (VGA) $806_1$, $806_2$, ..., $806_n$ via DACs $1004_1$, $1004_2$, ..., $1004_n$ so that the gains $G_{AM1}$, $G_{AM2}$, ..., $G_{AMn}$ of variable gain amplifiers (VGA) $806_1$, $806_2$, ..., $806_n$ can be set to the desired values calculated in the aforementioned operation.

In controller 807 illustrated in FIG. 22, each of ACPR detectors $1006_1$, $1006_2$, ..., $1006_n$ has a function of calculating and outputting ACPR that is a distortion amount of an input RF signal. RF signals $625_1$, $625_2$, ..., $625_n$ input to input terminals $813_1$, $813_2$, ..., $813_n$, are respectively input to ACPR detectors $1006_1$, $1006_2$, ..., $1006_n$. ACPR detectors $1006_1$, $1006_2$, ..., $1006_n$ respectively output the signal distortion amounts $ACPR_1$, $ACPR_2$, ..., $ACPR_n$ of RF signals $625_1$, $625_2$, ..., $625_n$ to ADCs $1005_1$, $1005_2$, ..., $1005_n$. The powers $ACPR_1$, $ACPR_2$, ..., $ACPR_n$ are converted into digital signals at ADCs $1005_1$, $1005_2$, ..., $1005_n$ to be input to MPU 1009.

In controller 807 illustrated in FIG. 22, MPU 1009 outputs the control signals of RF signal delay adjusters $804_1$, $804_2$, ..., $804_n$ to control terminal 815 via DAC 1007. MPU 1009 outputs the control signal of power supply modulation signal delay adjuster 810 to control terminal 816 via DAC 1008. Alternatively, by omitting DACs 1007 and 1008, RF signal delay adjusters $804_1$, $804_2$, ..., $804_n$ and power supply modulation signal delay adjuster 810 can be directly controlled from MPU 1009 based on digital signals.

In controller 807, MPU 1009 changes the signal delay time at RF signal delay adjusters $804_1$, $804_2$, ..., $804_n$ and power supply modulation signal delay adjuster 810 via control terminals 815 and 816, and simultaneously detects the signal distortion amounts $ACPR_1$, $ACPR_2$, ..., $ACPR_n$ of RF signals $625_1$, $625_2$, ..., $625_n$. Based on the signal distortion amounts $ACPR_1$, $ACPR_2$, ..., $ACPR_n$ of RF signals $625_1$, $625_2$, ..., $625_n$, the signal distortion amounts of RF signals $622_1$, $622_2$, ..., $622_n$ output from power amplifier 603 are detected. By this operation, MPU 1009 detects the dependency of the signal distortion amounts $ACPR_1$, $ACPR_2$, ..., $ACPR_n$ of RF signals $625_1$, $625_2$, ..., $625_n$ on the signal delay time at RF signal delay adjusters $804_1$, $804_2$, ..., $804_n$ and power supply modulation signal delay adjuster 810. Then, based on the data of the dependency, MPU 1009 sets the signal delay time at RF signal delay adjusters $804_1$, $804_2$, ..., $804_n$ and power supply modulation signal delay adjuster 810 so as to minimize the signal distortion amounts $ACPR_1$, $ACPR_2$, ..., $ACPR_n$ of RF signals $625_1$, $625_2$, ..., $625_n$.

Figure 23:
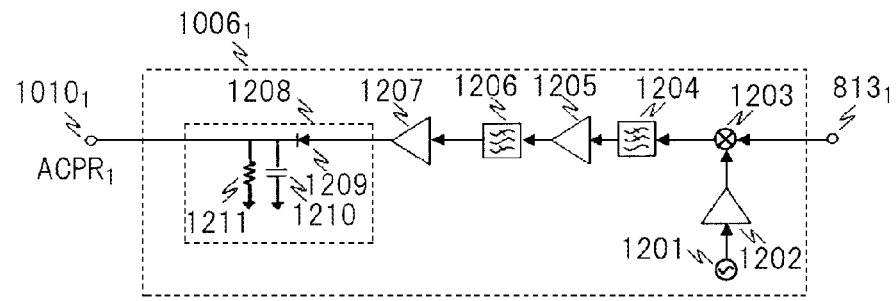
FIG. 23 A block diagram illustrating the block configuration of an adjacent channel leakage power ratio (ACPR) detector in the transmission apparatus according to the second exemplary embodiment of the present invention.

FIG. 23 is a block diagram illustrating the internal configuration of ACPR detector $1006_1$. As illustrated in FIG. 23, ACPR detector $1006_1$ includes at least local oscillation (LO) signal generator 1201, amplifiers 1202 and 1205, mixer 1203, low-pass filter (LPF) 1204, a band pass filter (BPF) 1206, log amplifier 1207, and detector 1208.

In ACPR detector $1006_1$ illustrated in FIG. 23, local oscillation (LO) signal generator 1201 outputs a local oscillation (LO) signal. The LO signal output from LO signal generator 1201 is amplified by amplifier 1202 to be output to mixer 1203. Mixer 1203 mixes the LO signal with RF signal $625_1$ input to input terminal $813_1$ to output an intermediate frequency (IF) signal to LPF 1204. LPF 1204 removes an unnecessary high-frequency component included in the IF signal. The IF signal output from LPF 1204 is amplified by amplifier 1205 to be input to BPF 1206. BPF 1206 passes only a frequency component corresponding to an adjacent channel. The center frequency of BPF 1206 is set to "IF frequency+offset frequency" or "IF frequency-offset frequency". The offset frequency and the pass-band width of BPF 1206 are defined according to a communication standard. For example, in the case of WCDMA (Wideband-CDMA) Standard, the offset frequency may be set to 5 MHz, and the pass-band width may be set to 3.84 MHz. The frequency component corresponding to the adjacent channel output from BPF 1206 is input to log amplifier 1207. Log amplifier 1207 subjects the frequency component signal corresponding to the adjacent channel to log scale conversion to output the result to detector 1208. Detector 1208 includes diode 1209, capacity 1210, and resistor 1211. Detector 1208 down-converts the output signal of log amplifier 1207 from the IF band to a baseband to output it as $ACPR_1$ to terminal $1010_1$.

ACPR detectors $1006_2$, ..., $1006_n$ are similar in internal configuration and function to ACPR detector $1006_1$.

Based on the circuit configuration and the operation described above, in the second exemplary embodiment of the present invention, as in the case of the first exemplary embodiment, in the transmission apparatus that simultaneously transmits the plurality of RF signals having different carrier frequencies, even when the output power of the RF signal is reduced, power efficiency can be maintained high.

First Modified Example of Second Exemplary Embodiment

Figure 24:
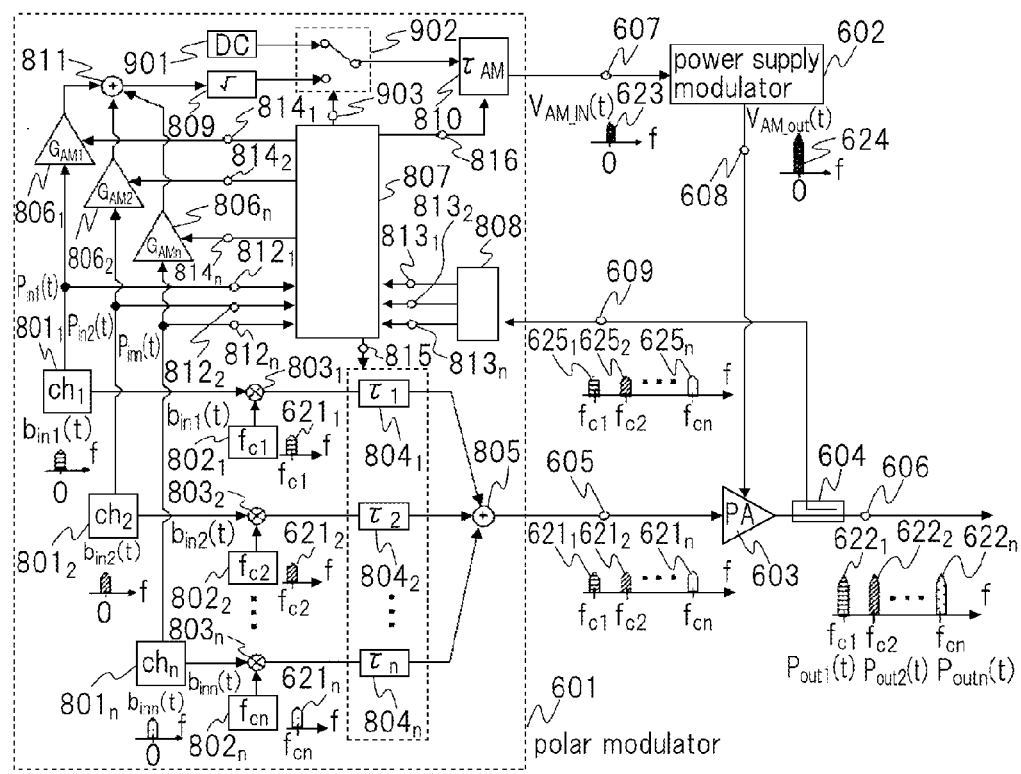
FIG. 24 A block diagram illustrating the block configuration of a polar modulator in a transmission apparatus according to the first modified example or the second modified example of the second exemplary embodiment of the present invention.

FIG. 24 illustrates the block configuration of a transmission apparatus according to the first modified example of the second exemplary embodiment of the present invention. In the transmission apparatus according to the first modified example of the second exemplary embodiment, DC power source 901, switch 902, and control terminal 903 of switch 902 are newly added to the transmission apparatus of the second exemplary embodiment illustrated in FIG. 21. DC power source 901 outputs a fixed voltage $V_{th}$. Switch 902 has a function of connecting the input of power supply modulation signal delay adjuster 810 to the output of DC power source 901 or the output of square root extractor 809. Which of the output of DC power source 901 and the output of square root extractor 809 switch 902 connects to the input of power supply modulation signal delay adjuster 810 is designated by a control signal input to control terminal 903.

Components other than DC power source 901, switch 902, and control terminal 903 are similar between the second exemplary embodiment of the present invention illustrated in FIG. 21 and the first modified example of the second exemplary embodiment of the present invention illustrated in FIG. 24. Hereinafter, in the first modified example of the second exemplary embodiment, only operations changed from the second exemplary embodiment will be described.

Figure 25:
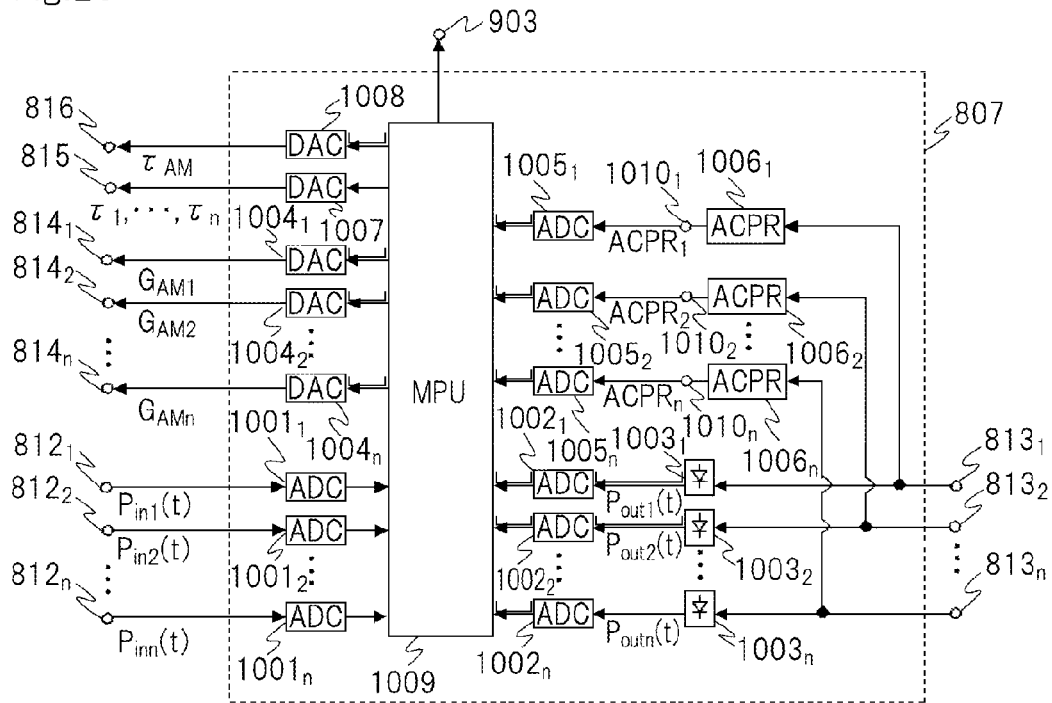
FIG. 25 A block diagram illustrating the block configuration of a controller in the transmission apparatus according to the first modified example to the fourth modified example of the second exemplary embodiment of the present invention.

FIG. 25 is a block diagram illustrating the internal configuration of controller 807 according to the first modified example of the second exemplary embodiment of the present invention. Control terminal 903 is connected to MPU 1009.

In the first modified example of the second exemplary embodiment, MPU 1009 in controller 807 calculates the sum total $P_{OUT1}(t)+P_{OUT2}(t)+ \ldots +P_{OUTn}(t)$ of the powers based on the detected powers $P_{OUT1}(t)$, $P_{OUT2}(t)$, ..., $P_{OUTn}(t)$ of RF signals $622_1$, $622_2$, ..., $622_n$. MPU 1009 outputs a control signal to control terminal 903 so that switch 902 can connect the output of square root extractor 809 to the input of power modulation signal delay adjuster 810 during a period where the power sum total is equal to or higher than a set threshold value. MPU 1009 outputs a control signal to control terminal 903 so that switch 902 can connect the output of DC power source 901 to the input of power modulation signal delay adjuster 810 during a period where the power sum total is equal to or higher than the set threshold value.

By the aforementioned operation, in the first modified example of the second exemplary embodiment of the present invention, the output voltage $V_{AM\_OUT}(t)$ of power supply modulator 602 is set to that defined by Formula (15) as shown below.

$$V_{AM\_OUT}(t) = \begin{cases} C\sqrt{P_{out1}(t) + P_{out2}(t) + \ldots + P_{outn}(t)} \\ \quad \left(\text{if } C\sqrt{P_{out1}(t) + P_{out2}(t) + \ldots + P_{outn}(t)} \geq V_{th}\right) \\ V_{th} \left(\text{if } C\sqrt{P_{out1}(t) + P_{out2}(t) + \ldots + P_{outn}(t)} \leq V_{th}\right) \end{cases} \quad \text{[Formula 15]}$$

Specifically, the power supply voltage $V_{AM\_OUT}$ is set to $C\sqrt{P_{out1}(t)+P_{out2}(t)+ \ldots +P_{outn}(t)}$ during a period where $P_{out1}(t)+P_{out2}(t)+ \ldots +P_{outn}(t) > (V_{th}/C)^2$ is satisfied. The power supply voltage $V_{AM\_OUT}$ is set to $V_{th}$ during a period where $P_{out1}(t)+P_{out2}(t)+ \ldots +P_{outn}(t) < (V_{th}/C)^2$ is satisfied.

In the case of $C\sqrt{P_{out1}(t)+P_{out2}(t)+ \ldots +P_{outn}(t)} = V_{th}$, an upper formula and a lower formula take equal values, and thus any of the two can be used.

The output voltage $V_{AM\_OUT}(t)$ of power supply modulator 602 given by Formula (15) corresponds to that obtained by expanding Formula (5) to a plurality of bands in the first modified example of the first exemplary embodiment.

Thus, in the first modified example of the second exemplary embodiment of the present invention, as in the case of the first modified example of the first exemplary embodiment, in the transmission apparatus that simultaneously transmits the plurality of RF signals having different carrier frequencies, even when the output power of the RF signal is reduced, power efficiency and power gains can be maintained high.

Second Modified Example of Second Exemplary Embodiment

A transmission apparatus according to the second modified example of the second exemplary embodiment of the present invention has, as in the case of the first modified example of the second exemplary embodiment, the block configuration illustrated in FIG. 24. Hereinafter, in the second modified example of the second exemplary embodiment, only operations changed from the first modified example of the second exemplary embodiment will be described.

In the second modified example of the second exemplary embodiment of the present invention, the output voltage $V_{AM\_OUT}(t)$ of power supply modulator 602 is set to that defined by Formula (16) as shown below.

$$V_{AM\_OUT}(t) = \begin{cases} C\sqrt{P_{out1}(t) + P_{out2}(t) + \ldots + P_{outn}(t)} \\ \text{(if } P_{out1}(t) + P_{out2}(t) + \ldots + P_{outn}(t) \leq P_{th2}) \\ C_2\sqrt{P_{th2}} \left( = C_1\sqrt{P_{th1}} \right) \\ \text{(if } P_{th2} \leq P_{out1}(t) + P_{out2}(t) + \ldots + P_{outn}(t) \leq P_{th1}) \\ C_1\sqrt{P_{out1}(t) + P_{out2}(t) + \ldots + P_{outn}(t)} \\ \text{(if } P_{th1} \leq P_{out1}(t) + P_{out2}(t) + \ldots + P_{outn}(t)) \end{cases}$$ [Formula 16]

A middle formula indicates that $C_2\sqrt{P_{th2}}$ and $C_1\sqrt{P_{th2}}$ take equal values.

In the case of $P_{out1}(t)+P_{out2}(t)+ \ldots +P_{outn}(t)=P_{th2}$, an upper formula and the middle formula take equal values, and thus any of the two can be used. In the case of $P_{out1}(t)+P_{out2}(t)+ \ldots +P_{outn}(t)=P_{th1}$, the middle formula and a lower formula take equal values, and thus any of the two can be used.

The output voltage $V_{AM\_OUT}(t)$ of power supply modulator 602 given by Formula (16) corresponds to that obtained by expanding Formula (6) to a plurality of bands in the second modified example of the first exemplary embodiment.

In the second modified example of the second exemplary embodiment, the output voltage $V_{AM\_OUT}(t)$ of power supply modulator 602 is set to that defined by Formula (16). Accordingly, the transmission apparatus performs the following operation. During a period where the sum total $P_{OUT1}(t)+P_{OUT2}(t)+ \ldots +P_{OUTn}(t)$ of the powers of RF signals $622_1, 622_2, \ldots, 622_n$ is equal to or higher than a first threshold value $P_{th1}$, MPU 1009 outputs the control signal of switch 902 to control terminal 903 so that switch 902 can connect the output of square root extractor 809 to the input of power modulation signal delay adjuster 810. During a period where the power sum total is equal to or lower than the first threshold value $P_{th1}$ and equal to or higher than a second threshold value $P_{th2}$, MPU 1009 outputs the control signal of switch 902 to control terminal 903 so that switch 902 can connect the output of DC power source 910 to the input of power modulation signal delay adjuster 810. During a period where the power sum total is equal to or lower than the second threshold value $P_{th2}$, MPU 1009 outputs a control signal to control terminal 903 so that switch 902 can connect the output of square root extractor 809 to the input of power modulation signal delay adjuster 810. By changing the setting values of the gains $G_{AM1}, G_{AM2}, \ldots, G_{AMn}$ of variable gain amplifiers (VGA) $806_1, 806_2, \ldots, 806_n$ between the period where the power sum total is equal to or higher than the first threshold value $P_{th1}$ and the period where the power sum total is equal to or lower than the second threshold value $P_{th2}$, the proportional coefficients $C_1$ and $C_2$ of the output voltage $V_{AM\_OUT}(t)$ of power supply modulator 602 are switched.

By the aforementioned operation, in the second modified example of the second exemplary embodiment of the present invention, an operation similar to that in the second modified example of the first exemplary embodiment is achieved. Thus, in the second modified example of the second exemplary embodiment of the present invention, as in the case of the second modified example of the first exemplary embodiment, in the transmission apparatus that simultaneously transmits the plurality of RF signals having different carrier frequencies, even when the output power of the RF signal is reduced, power efficiency and power gains can be maintained high.

Third Modified Example of Second Exemplary Embodiment

Figure 26:
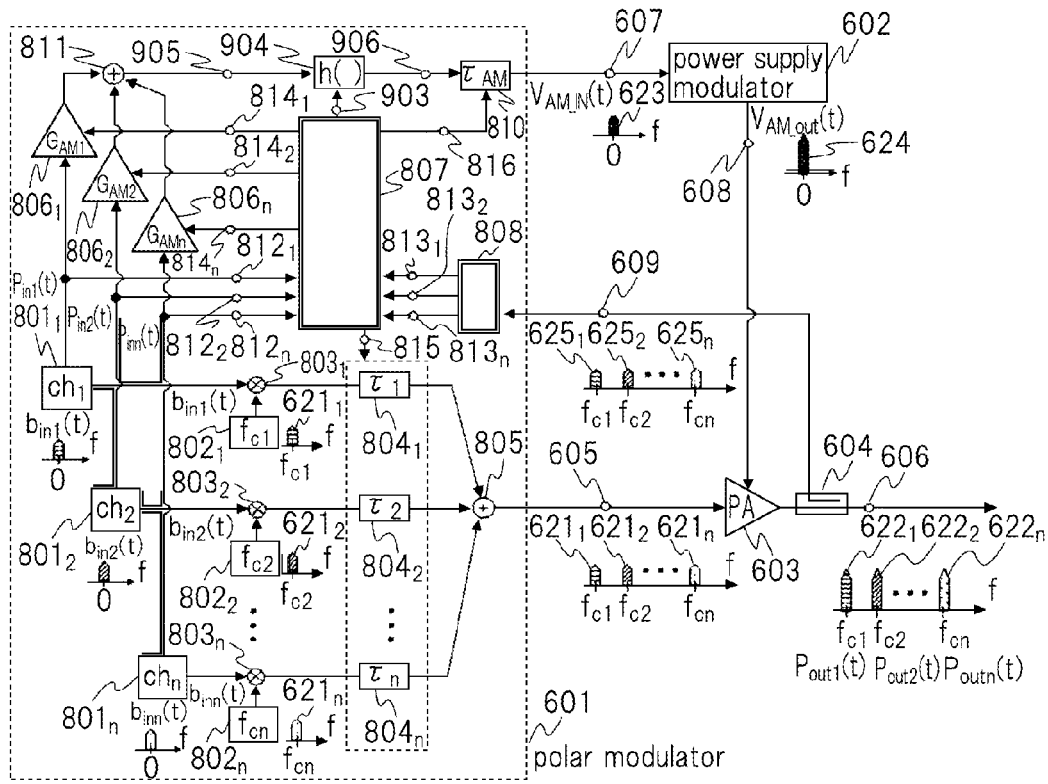
FIG. 26 A block diagram illustrating the block configuration of a polar modulator in a transmission apparatus according to the third modified example of the second exemplary embodiment of the present invention.

FIG. 26 illustrates the block configuration of a transmission apparatus according to the third modified example of the second exemplary embodiment of the present invention. In the transmission apparatus according to the third modified example of the second exemplary embodiment, square root extractor 809 is removed from the transmission apparatus of the second exemplary embodiment illustrated in FIG. 21, and nonlinear circuit 904 and terminals 903, 905, and 906 are newly added. In the transmission apparatus according to the third modified example of the second exemplary embodiment, the internal configuration of controller 807 is similar to that illustrated in FIG. 25.

In the transmission apparatus according to the third modified example of the second exemplary embodiment illustrated in FIG. 26, nonlinear circuit 904 has a function of outputting a signal h(x) to terminal 906 with respect to a signal x input to terminal 905. The sum total $P_{OUT1}(t)+P_{OUT2}(t)+ \ldots +P_{OUTn}(t)$ of the powers of RF signals $622_1, 622_2, \ldots, 622_n$ is input to terminal 905. Accordingly, a signal h ($P_{OUT1}(t)+P_{OUT2}(t)+ \ldots +P_{OUTn}(t)$) is output to terminal 906. In other words, in the transmission apparatus according to the third modified example of the second exemplary embodiment illustrated in FIG. 26, by the aforementioned operation, as in the case of the transmission apparatus according to the third modified example of the first exemplary embodiment, the output voltage $V_{AM\_OUT}(t)$ of power supply modulator 602 is set to that defined by Formula (8).

In the transmission apparatus according to the third modified example of the second exemplary embodiment illustrated in FIG. 26, a function h indicating the nonlinear characteristics of nonlinear circuit 904 is designated by MPU 1009 of controller 807 via control terminal 903. As in the case of the transmission apparatus according to the third modified example of the first exemplary embodiment, in the transmission apparatus according to the third modified example of the second exemplary embodiment, the function h can be defined by measuring a relationship between the saturation output power $P_{sat}$ of power amplifier 603 and the power supply voltage $V_{AM\_OUT}$ of power supply modulator 602 or set so as to obtain desired power efficiency and gains at power amplifier 603.

Figure 27:
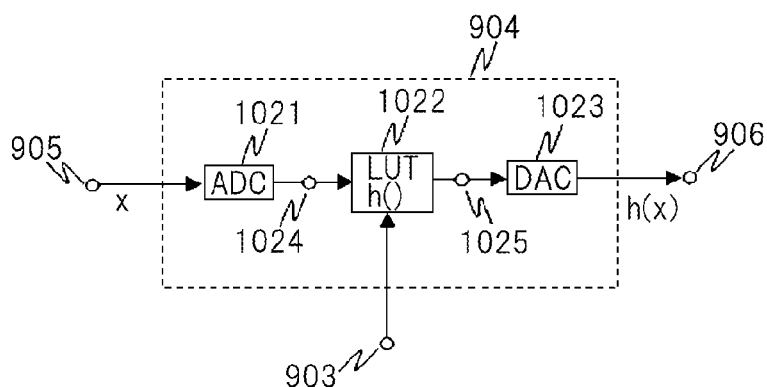
FIG. 27 A block diagram illustrating an example of the block configuration of a nonlinear circuit in the transmission apparatus according to the third modified example of the second exemplary embodiment of the present invention.

FIG. 27 illustrates the example of nonlinear circuit 904 in the third modified example of the second exemplary embodiment. In FIG. 27, nonlinear circuit 904 includes ADC 1021, lookup table (LUT) 1022, and DAC 1023. ADC 1021 converts the signal x input to terminal 905 into a digital signal to output the signal to LUT 1022 via terminal 1024. LUT 1022 is mounted in MPU, DSP, or FPGA. LUT 1022 stores a function h(x) using the signal x as an argument. The function h(x) is designated by MPU 1009 in controller 807, and input to LUT 1022 via control terminal 903. LUT 1022 outputs the digital value of the signal h(x) to DAC 1023 via terminal 1025 by referring to the input signal x and the stored function h. DAC 1023 converts the signal h(x) into an analog value to output it to terminal 906.

Figure 28:
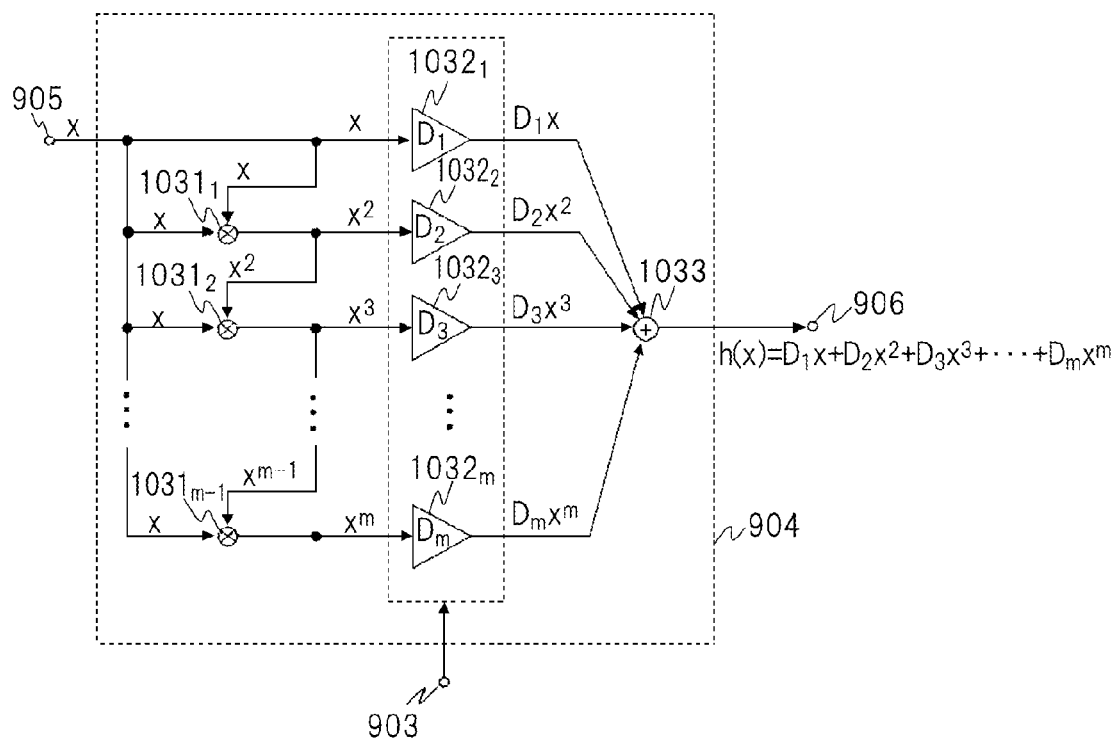
FIG. 28 A block diagram illustrating another example of the block configuration of the nonlinear circuit in the transmission apparatus according to the third modified example of the second exemplary embodiment of the present invention.

FIG. 28 illustrates another example of nonlinear circuit 904 in the third modified example of the second exemplary embodiment. In FIG. 28, nonlinear circuit 904 includes m−1 multipliers $1031_1$, $1031_2$, . . . , $1031_{m-1}$, m VGAs $1032_1$, $1032_2$, . . . , $1032_m$, and adder 1033. Here, m is a polynomial degree when the function h is represented by a polynomial expression. Multipliers $1031_1$, $1031_2$, . . . , $1031_{m-1}$ can be mounted in an analog multiplication circuit disclosed in Chapter 7 of Non-patent Literature 6 described in the section of Non-patent Literature. Adder 1033 can be mounted in an operation amplifier according to the method disclosed in Chapter 5 of Non-patent Literature 6 described in the section of Non-patent Literature. In nonlinear circuit 904 illustrated in FIG. 28, the signal x of terminal 905 is input to multiplier $1031_1$, and multiplier $1031_1$ outputs a power signal $x^2$. The signal x of terminal 905 and the output signal $x^k$ of multiplier $1031_{k-1}$ are input to multiplier $1031_k$ (k=2, 3, . . . , m), and a power signal $x^{k+1}$ that is a product of the signal x and the signal $x^k$ is output. Signals x, $x^2$, $x^3$, . . . , $x^m$ generated by this operation are respectively input to VGAs $1032_1$, $1032_2$, . . . , $1032_m$. VGAs $1032_1$, $1032_2$, . . . , $1032_m$ respectively have gains $D_1$, $D_2$, $D_3$, . . . , $D_m$, and outputs signals $D_1 x$, $D_2 x^2$, $D_3 x^3$, . . . $D_m x^m$ amplified by the gains to adder 1033. Adder 1033 adds together input signals from VGAs $1032_1$, $1032_2$, . . . , $1032_m$ to output a signal $h(x)=D_1 x+D_2 x^2+D_3 X^3+ \ldots +D_m x^m$ to terminal 906. The function h is represented as a polynomial expression of x using coefficients $D_1$, $D_2$, $D_3$, . . . , $D_m$. The gains $D_1$, $D_2$, $D_3$, . . . , $D_m$ of VGAs $1032_1$, $1032_2$, . . . , $1032_m$ are controlled by MPU 1009 in controller 807 via control terminal 903. A function h(x) is designated by control of the gains $D_1$, $D_2$, $D_3$, . . . , $D_m$ of VGAs $1032_1$, $1032_2$, . . . , $1032_m$.

Fourth Modified Example of Second Exemplary Embodiment

Figure 29:
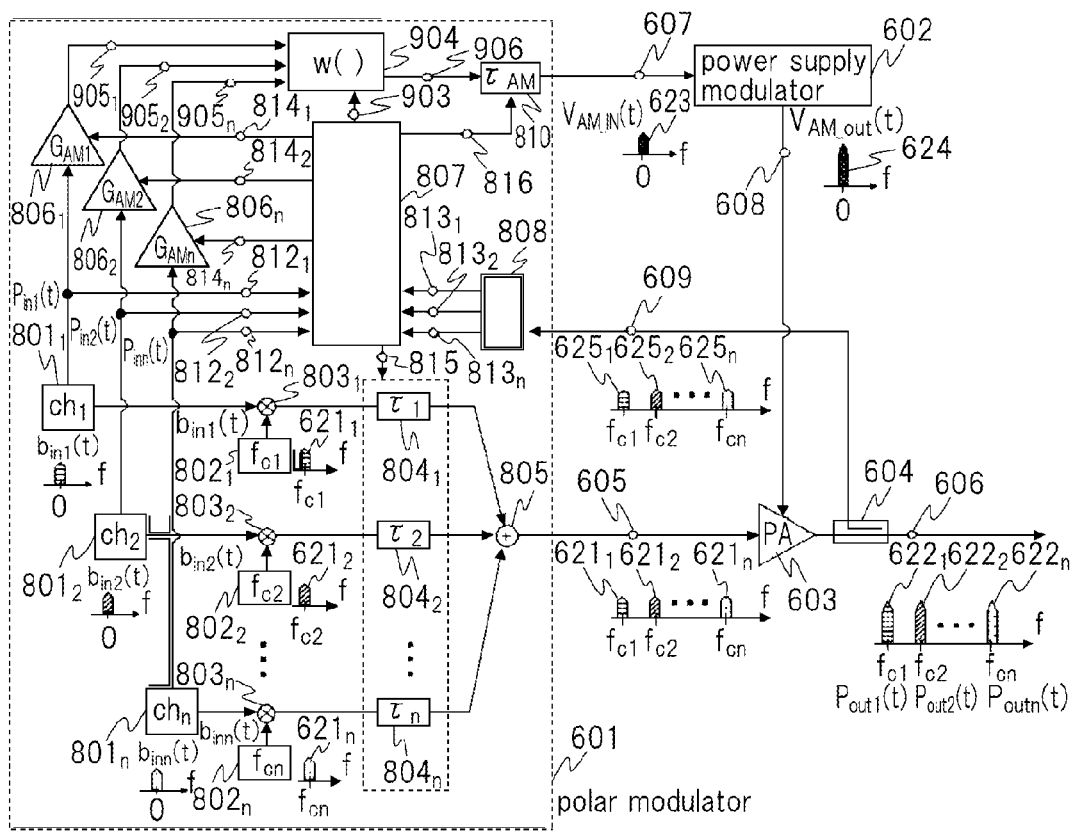
FIG. 29 A block diagram illustrating the block configuration of a polar modulator in the transmission apparatus according to the fourth modified example of the second exemplary embodiment of the present invention.

FIG. 29 illustrates the block configuration of a transmission apparatus according to the fourth modified example of the second exemplary embodiment of the present invention. In the transmission apparatus according to the fourth modified example of the second exemplary embodiment, adder 811 is removed from the transmission apparatus of the third modified example of the second exemplary embodiment illustrated in FIG. 26, and the output signals of VGAs $806_1$, $806_2$, . . . , $806_n$ are directly input to nonlinear circuit 904 via terminals $905_1$, $905_2$, . . . , $905_n$. Signals proportional to the powers $P_{OUT1}(t)$, $P_{OUT2}(t)$, . . . , $P_{OUTn}(t)$ of RF signals $622_1$, $622_2$, . . . , $622_n$ are respectively input to terminals $905_1$, $905_2$, . . . , $905_n$. Nonlinear circuit 904 has a function of outputting a signal $w[P_{OUT1}(t), P_{OUT2}(t), \ldots, P_{OUTn}(t)]$ to terminal 906 by using the input signals $P_{OUT1}(t)$, $P_{OUT2}(t)$, . . . , $P_{OUTn}(t)$ as arguments. In other words, in the transmission apparatus according to the fourth modified example of the second exemplary embodiment, an operation similar to that in the fourth modified example of the first exemplary embodiment is performed.

Figure 30:
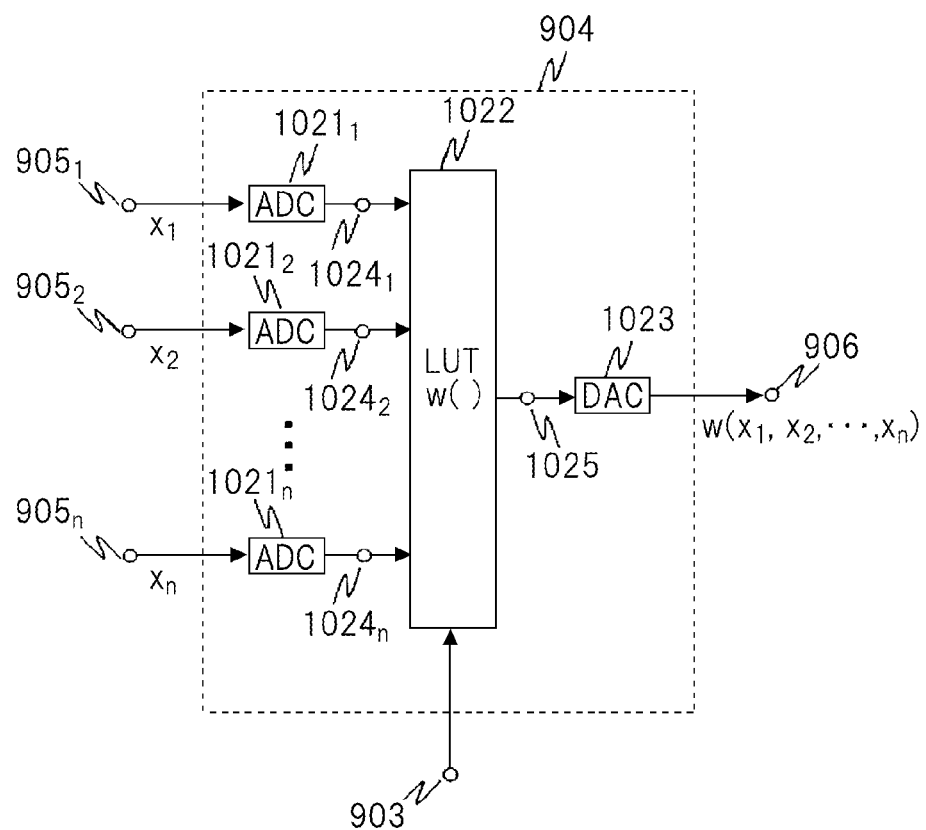
FIG. 30 A block diagram illustrating the block configuration of a nonlinear circuit in the transmission apparatus according to the fourth modified example of the second exemplary embodiment of the present invention.

FIG. 30 illustrates the example of nonlinear circuit 904 in the fourth modified example of the second exemplary embodiment. In FIG. 30, nonlinear circuit 904 includes ADCs $1021_1$, $1021_2$, . . . , $1021_n$, lookup table (LUT) 1022, and DAC 1023. In nonlinear circuit 904, signals $x_1$, $x_2$, . . . , $x_n$ are respectively input to terminals $905_1$, $905_2$, . . . $905_n$. ADCs $1021_1$, $1021_2$, . . . , $1021_n$ convert the signals $x_1$, $x_2$, . . . , $x_n$ of terminals $905_1$, $905_2$, . . . $905_n$ into digital values to output the signals to LUT 1022 via terminals $1024_1$, $1024_2$, . . . , $1024_n$. LUT 1022 stores a function $w(x_1, x_2, \ldots, x_n)$ using the signals $x_1$, $x_2$, . . . , $x_n$ as arguments. The function $w(x_1, x_2, \ldots, x_n)$ is designated by MPU 1009 in controller 807, and input to LUT 1022 via control terminal 903. LUT 1022 outputs the digital value of the signal $w(x_1, x_2, \ldots, x_n)$ to DAC 1023 via terminal 1025 by referring to the input signals $x_1$, $x_2$, . . . , $x_n$ and the function $w(x_1, x_2, \ldots, x_n)$. DAC 1023 converts the signal $w(x_1, x_2, \ldots, x_n)$ into an analog value to output it to terminal 906.

The transmission apparatus of the present invention has the following effects as compared with those disclosed in Patent Literatures 1 to 5.

In the case of the transmission apparatuses described in Patent Literatures 1 to 5, the RF signal of one carrier frequency is amplified by one power amplifier (PA). Thus, when the RF signals of n carrier frequencies are amplified, n power amplifiers (PA) are necessary. Since power supply modulation (polar modulation) is individually applied for each PA, n power supply modulators are necessary.

On the other hand, in the case of the transmission apparatuses according to the exemplary embodiments of the present invention, the RF signals of n carrier frequencies are simultaneously amplified by one power amplifier (PA). Thus, the number of PAs is one, irrespective of the number of RF signals of carrier frequencies to be amplified. In the present invention, only one PA is used, and accordingly only one power modulator is necessary. Thus, compared with those disclosed in Patent Literatures 1 to 5, in the transmission apparatuses of the exemplary embodiments, the transmission apparatus of higher power efficiency can be configured by smaller numbers of power amplifiers (PA) and power supply modulators. As a result, a circuit size and costs can be reduced.

In the case of the transmission apparatuses described in Patent Literatures 1 to 5, there is a need to install a switch for changing a used band between the input and the output of the power amplifier. The use of such a switch causes the problem of the reduction of the power efficiency of the entire transmission apparatus due to the insertion loss of the switch in addition to the problem of the increase of the circuit size and the costs caused by the increased number of components.

On the other hand, in the case of the transmission apparatuses according to the exemplary embodiments of the present invention, there is no need to install any switch for changing a used band between the input and the output of the power amplifier. Thus, the problems of the increase of the circuit size and the costs caused by a switch and the reduction of the power efficiency of the entire transmission apparatus due to the insertion loss of a switch can be solved.

In the case of the transmission apparatuses described in Patent Literatures 1 to 5, the method for switching the power amplifiers used in the band changing switch imposes restrictions, namely, inhibition of simultaneous outputting of the RF signals of all bands processable by the transmission apparatus. Because of the restrictions, the transmission apparatuses described in Patent Literatures 1 to 5 have a problem of unsuitability to the CA technology for performing communication by simultaneously using a plurality of bands.

On the other hand, in the case of the transmission apparatuses according to the exemplary embodiments of the present invention, the RF signals of an arbitrary number of bands can be simultaneously output, and the CA technology can be employed.

The configurations of the preferred exemplary embodiments of the present invention have been described. The contents disclosed in Patent Literatures can be incorporated by reference in the invention. Within the framework of the entire disclosure (including the scope of claims) of the present invention, based on the basic technical ideas, changes and adjustments can be made of the exemplary embodiments. Within the framework of the scope of claims of the present invention, a wide variety of combinations of various disclosed elements or selection can be made. In other words, needless to say, the present invention includes various changes and modifications obtainable by those skilled in the art according to the entire disclosure including the scope of claims and the technical ideas.

For example, in the second exemplary embodiment of the present invention, the adjacent channel leakage power (ACPR) is used as a signal distortion index, and the ACPR detector is installed as the signal distortion detector. However, the present invention is not limited to this. The signal distortion detector can use, as a signal distortion index, EVM (Error Vector Magnitude), IMD (Inter-modulation distortion), or MER (Modulation Error Ratio).

The invention claimed is:

1. A transmission apparatus comprising:
a polar modulator that generates a power supply modulation signal and RF (Radio Frequency) signals of a plurality of carrier frequency bands to be transmitted;
a power amplifier that amplifies the RF signals from the polar modulator; and
a power supply modulator that modulates a power supply terminal of the power amplifier by a signal obtained by amplifying the power supply modulation signal from the polar modulator,
wherein the power supply modulation signal is set based on a function using, as an argument, the power of the RF signal of each carrier frequency band output from the power amplifier.

2. The transmission apparatus according to claim 1, wherein the power supply modulation signal is set based on a function using, as an argument, a sum total of the powers of the RF signals of the carrier frequency bands output from the power amplifier.

3. The transmission apparatus according to claim 2, wherein the power supply modulation signal is set based on a function proportional to a square root of the sum total of the powers of the RF signals of the carrier frequency bands output from the power amplifier.

4. The transmission apparatus according to claim 3, wherein:
the polar modulator includes:
a plurality of baseband signal generators;
RF signal delay adjusters, local oscillation signal generators, mixers, and variable gain amplifiers equal in number to the baseband signal generators; and
at least one RF signal synthesizer, at least one controller, at least one branching filter, at least one adder, at least one square root extractor, and at least one power supply modulation signal delay adjuster; and wherein:
each baseband signal generator transmits a generated baseband signal of each channel to each mixer directly or via each RF signal delay adjuster;
each local oscillation signal generator transmits a local oscillation signal of a carrier frequency of each channel to each mixer;
each mixer transmits a RF signal of each channel obtained by mixing the baseband signal of each channel with the local oscillation signal of the carrier frequency of each channel to the RF signal synthesizer directly or via each RF signal delay adjuster;
the RF signal synthesizer transmits a RF signal obtained by synthesizing RF signals of the respective channels to the power amplifier;
each RF signal delay adjuster delays the baseband signal or the RF signal of each channel by signal delay time designated by the controller to transmit the signal to each mixer or the RF signal synthesizer;
each baseband signal generator transmits a power value of the generated baseband signal of each channel to each variable gain amplifier and the controller;
the branching filter separates the RF signal output from the power amplifier by each carrier frequency to output the signal to the controller;
the controller designates a gain of each variable gain amplifier based on the power value of the baseband signal of each channel and a power value of the RF signal output from the power amplifier;
each variable gain amplifier amplifies or attenuates the power value of the baseband signal of each channel based on a value of the gain designated by the controller to transmit the value to the adder;
the adder transmits a sum total of signals from the respective variable gain amplifiers to the square root extractor; and
the square root extractor outputs a signal proportional to a square root of a signal from each adder to the power supply modulator via the power supply modulation signal delay adjuster.

5. The transmission apparatus according to claim 2, wherein:
during a period where the sum total of the powers of the RF signals of the carrier frequency bands output from the power amplifier is equal to or higher than a given threshold value, the power supply modulation signal is set to a function proportional to a square root of the sum total of the power; and
during a period where the sum total of the power is equal to or lower than the threshold value, the power supply modulation signal is set to a fixed value.

6. The transmission apparatus according to claim 5, wherein:
the polar modulator includes:
a plurality of baseband signal generators;
RF signal delay adjusters, local oscillation signal generators, mixers, and variable gain amplifiers equal in number to the baseband signal generators; and at least one RF signal synthesizer, at least one controller, at least one branching filter, at least one adder, at least one square root extractor, at least one DC power source, at least one switch, and at least one power supply modulation signal delay adjuster; and wherein:

each baseband signal generator transmits a generated baseband signal of each channel to each mixer directly or via each RF signal delay adjuster;

each local oscillation signal generator transmits a local oscillation signal of a carrier frequency of each channel to each mixer;

each mixer transmits a RF signal of each channel obtained by mixing the baseband signal of each channel with the local oscillation signal of the carrier frequency of each channel to the RF signal synthesizer directly or via each RF signal delay adjuster;

the RF signal synthesizer transmits a RF signal obtained by synthesizing RF signals of the respective channels to the power amplifier;

each RF signal delay adjuster delays the baseband signal or the RF signal of each channel by signal delay time designated by the controller to transmit the signal to each mixer or the RF signal synthesizer;

each baseband signal generator transmits a power value of the generated baseband signal of each channel to each variable gain amplifier and the controller;

the branching filter separates the RF signal output from the power amplifier by each carrier frequency to output the signal to the controller;

the controller designates a gain of each variable gain amplifier based on the power value of the baseband signal of each channel and a power value of the RF signal output from the power amplifier;

each variable gain amplifier amplifies or attenuates the power value of the baseband signal of each channel based on a value of the gain designated by the controller to transmit the value to the adder;

the adder transmits a sum total of signals from the respective variable gain amplifiers to the square root extractor;

the square root extractor outputs a signal proportional to a square root of a signal from each adder to the switch;

the DC power source outputs a designated DC voltage to the switch; and the switch selects, based on a sum total of powers of the RF signals of carrier frequencies detected by the controller and output from the power amplifier, a signal from the adder or a signal from the DC power source, and outputs the signal to the power supply modulator via the power supply modulation signal delay adjuster.

7. The transmission apparatus according to claim 2, wherein:

during a period where the sum total of the powers of the RF signals of the carrier frequency bands output from the power amplifier is equal to or higher than a first threshold value, the power supply modulation signal is set to a function proportional to a square root of the sum total of the power;

during a period where the sum total of the power is equal to or lower than the first threshold value and equal to or higher than a second threshold value, the power supply modulation signal is set to a fixed value; and during a period where the sum total of the power is equal to or lower than the second threshold value, the power supply modulation signal is set to a function proportional to a square root of the sum total of the power.

8. The transmission apparatus according to claim 2, wherein:

the polar modulator includes:

a plurality of baseband signal generators;

RF signal delay adjusters, local oscillation signal generators, mixers, and variable gain amplifiers equal in number to the baseband signal generators; and at least one RF signal synthesizer, at least one controller, at least one branching filter, at least one nonlinear circuit, at least one power supply modulation signal delay adjuster, and at least one adder; and wherein:

each baseband signal generator transmits a generated baseband signal of each channel to each mixer directly or via each RF signal delay adjuster;

each local oscillation signal generator transmits a local oscillation signal of a carrier frequency of each channel to each mixer;

each mixer transmits a RF signal of each channel obtained by mixing the baseband signal of each channel with the local oscillation signal of the carrier frequency of each channel to the RF signal synthesizer directly or via each RF signal delay adjuster;

the RF signal synthesizer transmits a RF signal obtained by synthesizing RF signals of the respective channels to the power amplifier;

each RF signal delay adjuster delays the baseband signal or the RF signal of each channel by signal delay time designated by the controller to transmit the signal to each mixer or the RF signal synthesizer;

each baseband signal generator transmits a power value of the generated baseband signal of each channel to each variable gain amplifier and the controller;

the branching filter separates the RF signal output from the power amplifier by each carrier frequency to output the signal to the controller;

the controller designates a gain of each variable gain amplifier based on the power value of the baseband signal of each channel and a power value of the RF signal output from the power amplifier;

each variable gain amplifier amplifies or attenuates the power value of the baseband signal of each channel based on a value of the gain designated by the controller to transmit the value to the adder; and the nonlinear circuit converts a signal from each adder by a nonlinear function designated by the controller to output the signal to the power supply modulator via the power supply modulation signal delay adjuster.

9. The transmission apparatus according to claim 1, wherein transmission timing of the RF signal of each carrier frequency band output from the polar modulator is set for the power supply modulation signal output from the power supply modulator so as to minimize a signal distortion amount of the RF signal of each carrier frequency band output from the power amplifier.

10. The transmission apparatus according to claim 1, wherein:

the polar modulator includes:

a plurality of baseband signal generators;

RF signal delay adjusters, local oscillation signal generators, mixers, and variable gain amplifiers equal in number to the baseband signal generators; and at least one RF signal synthesizer, at least one controller, at least one branching filter, at least one nonlinear circuit, and at least one power supply modulation signal delay adjuster; and wherein:

each baseband signal generator transmits a generated baseband signal of each channel to each mixer directly or via each RF signal delay adjuster;

each local oscillation signal generator transmits a local oscillation signal of a carrier frequency of each channel to each mixer;

each mixer transmits a RF signal of each channel obtained by mixing the baseband signal of each channel with the local oscillation signal of the carrier frequency of each channel to the RF signal synthesizer directly or via each RF signal delay adjuster;

the RF signal synthesizer transmits a RF signal obtained by synthesizing RF signals of the respective channels to the power amplifier;

each RF signal delay adjuster delays the baseband signal or the RF signal of each channel by signal delay time designated by the controller to transmit the signal to each mixer or the RF signal synthesizer;

each baseband signal generator transmits a power value of the generated baseband signal of each channel to each variable gain amplifier and the controller;

the branching filter separates the RF signal output from the power amplifier by each carrier frequency to output the signal to the controller;

the controller designates a gain of each variable gain amplifier based on the power value of the baseband signal of each channel and a power value of the RF signal output from the power amplifier;

each variable gain amplifier amplifies or attenuates the power value of the baseband signal of each channel based on a value of the gain designated by the controller to transmit the value to the nonlinear circuit; and the nonlinear circuit converts a signal from each variable gain amplifier by a nonlinear function designated by the controller to output the signal to the power supply modulator via the power supply modulation signal delay adjuster.

11. The transmission apparatus according to claim 10, wherein:

the nonlinear circuit includes:
an analog digital converter;
a look-up table; and
a digital analog converter;

the analog digital converter converts an input signal to the nonlinear circuit into a digital signal to output the signal to the look-up table;

the look-up table outputs a value obtained by applying a nonlinear function designated by the controller to the input signal from the analog digital converter to the digital analog converter; and the digital analog converter converts a signal input from the look-up table into an analog signal to output the signal to the power supply modulator via the power supply modulation signal delay adjuster.

12. The transmission apparatus according to claim 10, wherein:

the nonlinear circuit includes:
at least one multiplier, and at least one variable amplifier, and
one adder; and wherein:

the multiplier outputs each next power signal of an input signal of the nonlinear circuit to each variable amplifier;

each variable amplifier amplifies each next power signal by a gain designated by the controller to output the signal to the adder; and the adder outputs a sum total of output signals from the respective variable amplifiers to the power supply modulator via the power supply modulation signal delay adjuster.

13. The transmission apparatus according to claim 10, wherein:

the controller detects each of the power value of the baseband signal of each channel and the power of the RF signal of each carrier frequency band output from the power amplifier;

the controller calculates a gain of each carrier frequency band of the transmission apparatus based on the detected power value of the baseband signal of each channel and the detected power of the RF signal of each carrier frequency band output from the power amplifier; and the controller sets a gain of each variable gain amplifier so that a ratio of the gain of each variable gain amplifier can be equal to that of each carrier frequency band of the transmission apparatus.

14. The transmission apparatus according to claim 10, wherein:

the controller includes
at least one analog digital converter,
a digital analog converter,
a microprocessor unit,
a square-law detector, and
a signal distortion detector; and wherein:

the microprocessor receives the power value of the baseband signal of each channel input directly or via the analog digital converter;

the square-law detector outputs the power value of the RF signal of each carrier frequency band output from the power amplifier and input to the controller to the analog digital converter;

the signal distortion detector detects a signal distortion amount of the RF signal of each carrier frequency band output from the power amplifier and input to the controller to output the signal distortion amount to the analog digital converter;

the analog digital converter converts the power value and the signal distortion amount of the RF signal of each carrier frequency band into digital values to output the digital values to the microprocessor unit;

the microprocessor unit calculates a gain of each carrier frequency band of the transmission apparatus based on the power value of the baseband signal of each channel and the power value of the RF signal of each carrier frequency band output from the power amplifier;

the microprocessor unit outputs a control signal of the gain of the variable gain amplifier to the digital analog converter based on the gain of each carrier frequency band of the transmission apparatus;

the digital analog converter converts the control signal of the gain of the variable gain amplifier into an analog signal to output the analog signal to the variable gain amplifier;

the microprocessor unit outputs, based on the signal distortion amount of the RF signal of each carrier frequency band, a control signal of signal delay time of the RF signal delay adjuster and the power supply modulation signal delay adjuster to the RF signal delay adjuster and the power supply modulation signal delay adjuster directly or via the digital analog converter.

15. A transmission method implemented in a transmission apparatus that generates RF signals of a plurality of carrier frequency bands to transmit the RF signals via a power amplifier, the transmission method comprising:

the step of detecting power of the RF signal of each carrier frequency band output from the power amplifier;

the step of setting a power supply modulation signal based on a function using, as an argument, the detected power of the RF signal of each carrier frequency band; and the step of modulating a power supply terminal of the power amplifier by the power supply modulation signal output from a power supply modulator.

16. The transmission method according to claim 15, wherein in the power supply modulation signal setting step, the power supply modulation signal is set based on a function using, as an argument, a sum total of the powers of the RF signals of the carrier frequency bands output from the power amplifier.

17. The transmission method according to claim 16, wherein in the power supply modulation signal setting step, the power supply modulation signal is set based on a function proportional to a square root of the sum total of the powers of the RF signals of the carrier frequency bands output from the power amplifier.

18. The transmission method according to claim 16, wherein:

in the power supply modulation signal setting step, during a period where the sum total of the detected power of the RF signals of the carrier frequency bands output from the power amplifier is equal to or higher than a given threshold value, the power supply modulation signal is set to a function proportional to a square root of the sum total of the power; and during a period where the sum total of the power is equal to or lower than the threshold value, the power supply modulation signal is set to a fixed value.

19. The transmission method according to claim 16, wherein:

in the power supply modulation signal setting step, during a period where the sum total of the detected power of the RF signals of the carrier frequency bands output from the power amplifier is equal to or higher than a first threshold value, the power supply modulation signal is set to a function proportional to a square root of the sum total of the power;

during a period where the sum total of the power is equal to or lower than the first threshold value and equal to or higher than a second threshold value, the power supply modulation signal is set to a fixed value; and during a period where the sum total of the power is equal to or lower than the second threshold value, the power supply modulation signal is set to a function proportional to a square root of the sum total of the power.

20. The transmission method according to claim 15, further comprising:

the step of outputting the RF signal of each carrier frequency band from a polar modulator to the power amplifier;

the step of detecting a signal distortion amount of the RF signal of each carrier frequency band output from the power amplifier; and the step of setting transmission timing of the RF signal of each carrier frequency band output from the polar modulator for the power supply modulation signal output from the power supply modulator so as to minimize a signal distortion amount of the RF signal of each carrier frequency band.

* * * * *